(12) United States Patent
    Kanamaru

(10) Patent No.: US 8,117,578 B2
(45) Date of Patent: Feb. 14, 2012

(54) STATIC HAZARD DETECTION DEVICE, STATIC HAZARD DETECTION METHOD, AND RECORDING MEDIUM

(75) Inventor: Keisuke Kanamaru, Tokyo (JP)

(73) Assignee: NEC Corporation, Tokyo (JP)

( * ) Notice: Subject to any disclaimer, the term of this patent is extended or adjusted under 35 U.S.C. 154(b) by 476 days.

(21) Appl. No.: 12/343,212

(22) Filed: Dec. 23, 2008

(65) Prior Publication Data

US 2009/0172612 A1    Jul. 2, 2009

(30) Foreign Application Priority Data

Dec. 28, 2007  (JP) .................................. 2007-339000
Nov. 28, 2008  (JP) .................................. 2008-304099

(51) Int. Cl.
    *G06F 17/50*    (2006.01)
(52) U.S. Cl. ........................................ 716/110
(58) Field of Classification Search .................. 716/100, 716/110
    See application file for complete search history.

(56) References Cited

U.S. PATENT DOCUMENTS

| | | | |
|---|---|---|---|
| 2003/0033506 A1* | 2/2003 | Hinds et al. | 712/217 |
| 2003/0051121 A1* | 3/2003 | Arnold et al. | 712/216 |
| 2007/0011527 A1* | 1/2007 | Goswami et al. | 714/26 |
| 2007/0266348 A1* | 11/2007 | Yoshikawa | 716/3 |
| 2009/0327986 A1* | 12/2009 | Goswami et al. | 716/6 |

FOREIGN PATENT DOCUMENTS

JP    2006323727 A    11/2006

* cited by examiner

*Primary Examiner* — Suchin Parihar

(57) ABSTRACT

There is provided a check target extraction unit that receives logic circuit information describing a logic circuit, and extracts at least one set of a start point register and an end point register from registers in the logic circuit, the start point register outputting an exception signal to be supplied to the end point register via the propagation control circuit, and a static hazard detection unit that determines whether, for the at least one set extracted by the check target extraction unit, there are a plurality of paths through which propagation of an exception signal from a start point register to an end point register is possible when the propagation control circuit, in response to a control signal, inhibits propagation of the exception signal.

20 Claims, 21 Drawing Sheets

FIG. 3A

CHECK TARGET INFORMATION

| EXCEPTION SIGNAL START POINT REGESTER | EXCEPTION SIGNAL END POINT REGESTER | START POINT REGESTER OF CONTROL SIGNAL |
|---|---|---|
| STRB_reg1 | END_reg1 | MULT_reg1 |
| STRB_reg2 | END_reg2 | MULT_reg2 |
| STRB_reg3 | END_reg3 | MULT_reg3 |
| ⋮ | ⋮ | ⋮ |

FIG. 3B

PATH REPORT

| PATH REPORT NUMBER | EXCEPTION SIGNAL START POINT REGESTER | EXCEPTION SIGNAL END POINT REGESTER | PATH |
|---|---|---|---|
| 1 | STRB_reg2 | END_reg2 | STRB_reg2, ···, X21, ···, END_reg2 |
| 2 | STRB_reg3 | END_reg3 | STRB_reg3, ···, X31, ···, END_reg3 |
| 3 | STRB_reg3 | END_reg3 | STRB_reg3, ···, X32, ···, END_reg3 |
| ⋮ | ⋮ | ⋮ | ⋮ |

FIG. 3C

REPORT FOR A POTENTIALLY PROBLEMATIC PATH

| PATH REPORT NUMBER | EXCEPTION SIGNAL START POINT REGESTER | EXCEPTION SIGNAL END POINT REGESTER |
|---|---|---|
| 2, 3 | STRB_reg3 | END_reg3 |
| ⋮ | ⋮ | ⋮ |

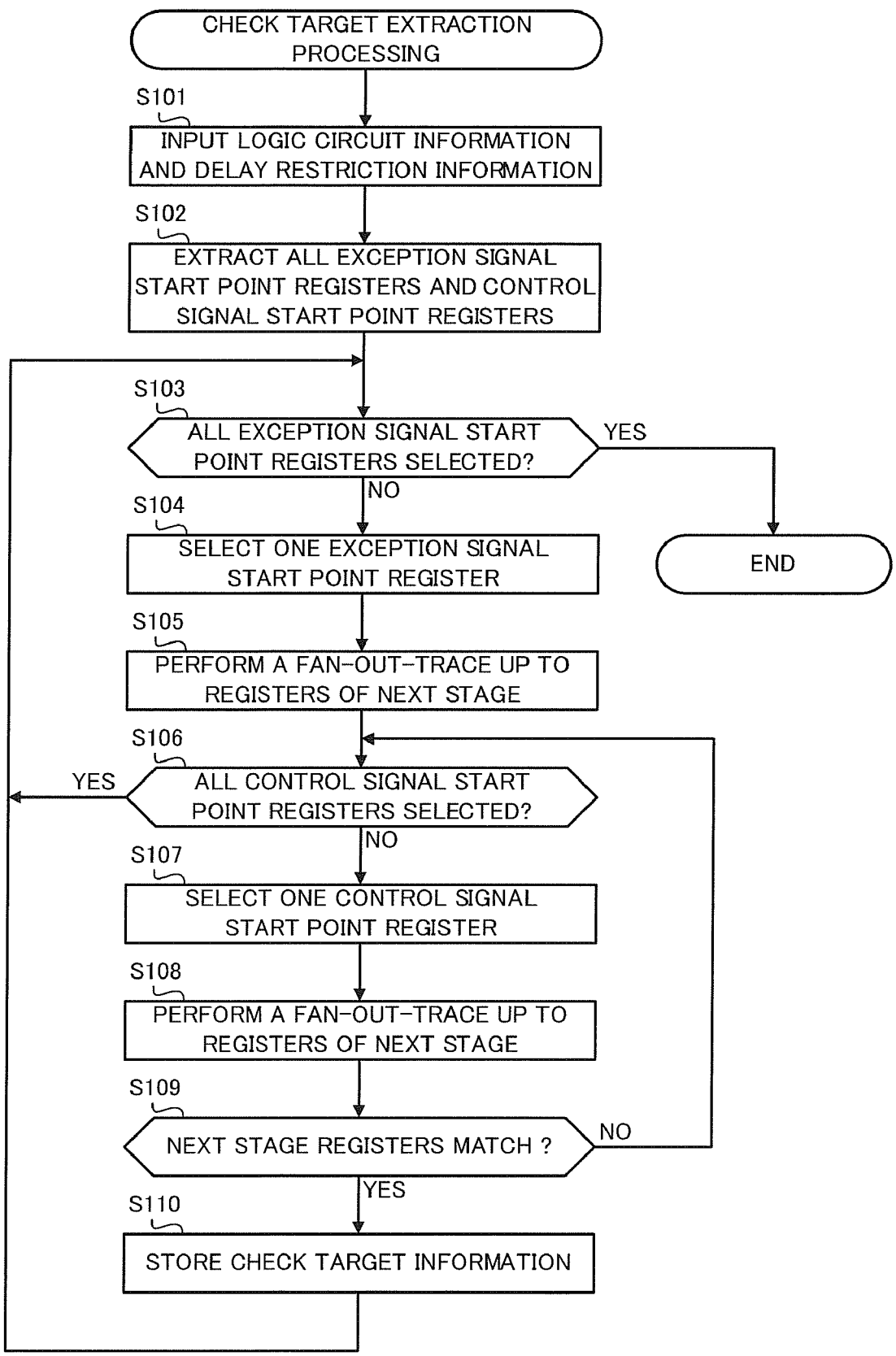

FIG. 6

```
set_multicycle_path 2 - from MULT_reg
```

FIG. 7

```
STROBE:STRB_reg 0
PATH:MULT_reg -> END_reg
```

FIG. 11

```
Path #1
Startpoint: MULT_reg
Endpoint: END_reg
_____

MULT_reg
U2
U3
END_reg
```

FIG. 13

Path #1
Startpoint: MULT_reg
Endpoint: END_reg
------------------------------
MULT_reg
U2
U5
END_reg Path #2
Startpoint: MULT_reg
Endpoint: END_reg
------------------------------
MULT_reg
U4
U3
U2
END_reg

FIG. 14

```
MULT_reg -> END_reg
Path #1, Path #2
```

FIG. 15

```
set_case_analysis 0 STRB_reg
report_timing-from MULT_reg-to END_reg
```

FIG. 19

```
set_multicycle_path 2 - to ENDO_reg
```

STATIC HAZARD DETECTION DEVICE, STATIC HAZARD DETECTION METHOD, AND RECORDING MEDIUM

This application is based on Japanese Patent Application No. 2007-339000 filed on Dec. 28, 2007 and Japanese Patent Application No. 2008-304099 filed on Nov. 28, 2008 and including specifications, claims, drawings and summaries. The disclosure of the above Japanese Patent Applications is incorporated herein by reference in its entirety.

BACKGROUND OF THE INVENTION

1. Field of the Invention

The present invention relates to static hazard detection technology that checks whether there is a possibility of a static hazard occurring at a logic circuit synthesized by a logic synthesis tool.

2. Description of the Related Art

In LSI design, a signal referred to as a control signal is introduced in order to control the propagation of an exception signal such as a multi-cycle signal or an asynchronous signal that is not propagated between registers within one clock signal period. A control signal is a signal that is in a first state (for example, '1') when it is acceptable to take in an exception signal and is in a second state (for example, '0') when taking in of an exception signal is not acceptable. For example, propagation of an exception signal can be controlled by taking an AND (logical product) of a control signal and an exception signal or by controlling a selector that selectively outputs the exception signal and other signals using a control signal. There are also cases where the control signal is referred to as a strobe signal.

However, there are also further cases where circuits are created that generate glitches as a result of unexpected synthesis by a logic synthesis tool regardless of a designer writing HDL (Hardware Description Language) intended for a circuit for controlling propagation of an exception signal using a control signal. This means that control using the control signal is no longer effective and that the circuit operates erroneously. This problem is referred to as a static hazard.

Static hazards cannot be identified at the RTL (Register Transfer Level) stage. It is therefore necessary for an inspector to check for the occurrence of a static hazard by visually examining and analyzing the circuits generated by the logic synthesis tools individually. This method requires an enormous number of steps however, and there is still a danger of a static hazard going undetected.

On the other hand, technology is disclosed in, for example, Unexamined Japanese Patent Application KOKAI Publication No. 2006-323727, for detecting logical blocks where it is possible that glitches have occurred. In Unexamined Japanese Patent Application KOKAI Publication No. 2006-323727, technology is disclosed where paths are searched for two signals designated within the logic circuit. Logic blocks that propagation signals for the two signals are inputted to are then detected. This enables logic blocks where the occurrence of glitches is possible to be detected. Two asynchronous signals (exception signals) are specified as the two signals.

SUMMARY OF THE INVENTION

The technology disclosed in Unexamined Japanese Patent Application KOKAI Publication No. 2006-323727 does not take into consideration a control signal that controls propagation of an exception signal. The technology disclosed in Unexamined Japanese Patent Application KOKAI Publication No. 2006-323727 is not technology that can be immediately applied to logic circuits into which a control signal that controls the propagation of an exception signal is introduced.

In order to resolve the above problems, it is therefore an object of the present invention to provide a static hazard detection device, a static hazard detection method, and a recording medium for storing a program for implementing these on a computer that are capable of checking whether the occurrence of a static hazard is possible even for logic circuits where a control signal that controls the propagation of an exception signal is introduced.

In order to achieve the above object, a static hazard detection device of a first aspect of the present invention is:

a static hazard detection device that detects a static hazard occurring at a logic circuit where propagation of an exception signal that propagates without being synchronized with a logic circuit operating clock is controlled by a propagation control circuit, the static hazard detection device that comprises:

a check target extraction unit that receives logic circuit information describing a logic circuit, and extracts at least one set of a start point register and an end point register from registers in the logic circuit, the start point register outputting an exception signal to be supplied to the end point register via the propagation control circuit; and a static hazard detection unit that determines whether, for the at least one set extracted by the check target extraction unit, there are a plurality of paths through which propagation of an exception signal from a start point register to an end point register is possible when the propagation control circuit, in response to a control signal, inhibits propagation of the exception signal.

In order to achieve the above object, a static hazard detection method of a second aspect of the present invention is:

a static hazard detection method executed by a static hazard detection device that detects a static hazard potentially occurring at a logic circuit that controls the propagation of an exception signal by a propagation control circuit, the exception signal being propagated without being synchronized to an operating clock of a logic circuit, with the static hazard detection device comprising a check target extraction unit and a static hazard detection unit;

the method comprising: a check target extraction step where the check target extraction unit receiving logic circuit information describing a logic circuit, and extracting at least one set of a start point register and an end point register from registers in the logic circuit, the start point register outputting an exception signal to be supplied to the end point register via the propagation control circuit; and a static hazard detection step where the static hazard detection unit determines whether, for the at least one set extracted by the check target extraction unit, there are a plurality of paths through which propagation of an exception signal from a start point register to an end point register is possible when the propagation control circuit, in response to a control signal, inhibits propagation of the exception signal.

In order to achieve the above object, a recording medium of a third aspect of the present invention is a recording medium that stores a program allowing a computer to function as a static hazard detection device that detects a static hazard potentially occurring at a logic circuit that controls the propagation of an exception signal by a propagation control circuit, the exception signal being propagated without being synchronized to an operating clock of a logic circuit, the program allowing the computer to function as:

a check target extraction unit that receives logic circuit information describing a logic circuit, and extracts at least one set of a start point register and an end point register from registers in the logic circuit, the start point register outputting an exception signal to be supplied to the end point register via the propagation control circuit; and a static hazard detection unit that determines whether, for the at least one set extracted by the check target extraction unit, there are a plurality of paths through which propagation of an exception signal from a start point register to an end point register is possible when the propagation control circuit, in response to a control signal, inhibits propagation of the exception signal.

BRIEF DESCRIPTION OF THE DRAWINGS

These objects and other objects and advantages of the present invention will become more apparent upon reading of the following detailed description and the accompanying drawings.

FIG. 3A is a view schematically showing check target information;

FIG. 3B is a view schematically showing a path report;

FIG. 3C is a view schematically showing a report for a potentially problematic path;

FIG. 4 is an example of a flowchart showing check target extraction processing of the first embodiment;

FIG. 6 is a diagram showing an example of delay restriction information;

FIG. 7 is a diagram showing an example of a path report;

FIG. 11 is a diagram showing an example of a path report generated while the logic circuit shown in FIG. 10 is a check target;

FIG. 13 is a diagram showing an example of a path report generated while the logic circuit shown in FIG. 12 is a check target;

FIG. 14 is a diagram showing an example of a report for a potentially problematic path generated while the logic circuit shown in FIG. 12 is a check target;

FIG. 15 is a diagram showing an example of command for a static delay analyzer;

FIG. 19 is a diagram showing an example of delay restriction information;

DETAILED DESCRIPTION

First Embodiment

The following is an explanation with reference to the drawings of the static hazard detection device 100 of a first embodiment of the present invention.

Figure 1:
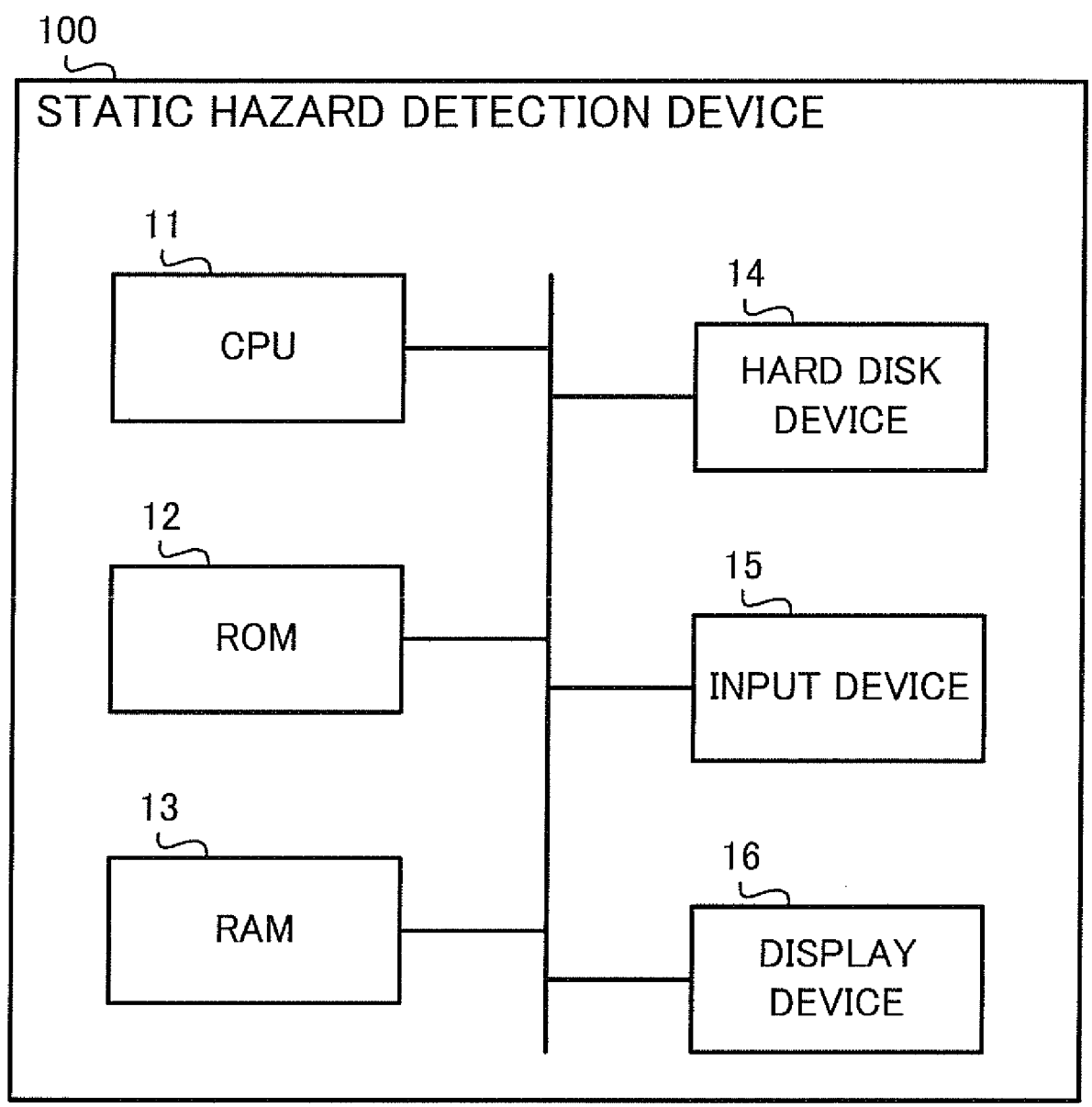
FIG. 1 is a block diagram showing a configuration for a static hazard detection device 100 of first to third embodiments of the present invention.

First, an explanation is given of the physical structure of the static hazard detection device 100 of this embodiment with reference to FIG. 1. The static hazard detection device 100 can be made using a general-purpose computer such as a personal computer.

As shown in FIG. 1, the static hazard detection device 100 physically includes a CPU (Central Processing Unit) 11, a ROM (Read-Only Memory) 12, a RAM (Random Access Memory) 13, a hard disk device 14, an input device 15, and a display device 16. Each of the structural elements that the static hazard detection device 100 includes is connected via a bus.

The CPU 11 controls the overall operation of the static hazard detection device 100 in accordance with the program stored in the hard disk device 14. The CPU 11 then exchanges control signals and data via the bus connecting each of the structural elements.

An IPL (Initial Program Loader) executed immediately after the power supply is turned on is stored in the ROM 12. After the IPL is executed, the CPU 11 reads out programs stored in the hard disk device 14 to the RAM 13 and executes the programs.

The RAM 13 then temporarily stores the data and programs. The RAM 13 temporarily stores programs and data or the like. read out from the hard disk device 14.

The hard disk device 14 stores programs executed by the CPU 11 and various data or the like.

The input device 15 receives various operation inputs from the user under the control of the CPU 11. The input device 15 is, for example, a keyboard and mouse.

The display device 16, under the control of the CPU 11, displays a screen to receive various operation inputs from the user. The display device 16 is, for example, a liquid crystal display device.

Next, an explanation is given of the functional structure of the static hazard detection device 100 of this embodiment.

Figure 2:
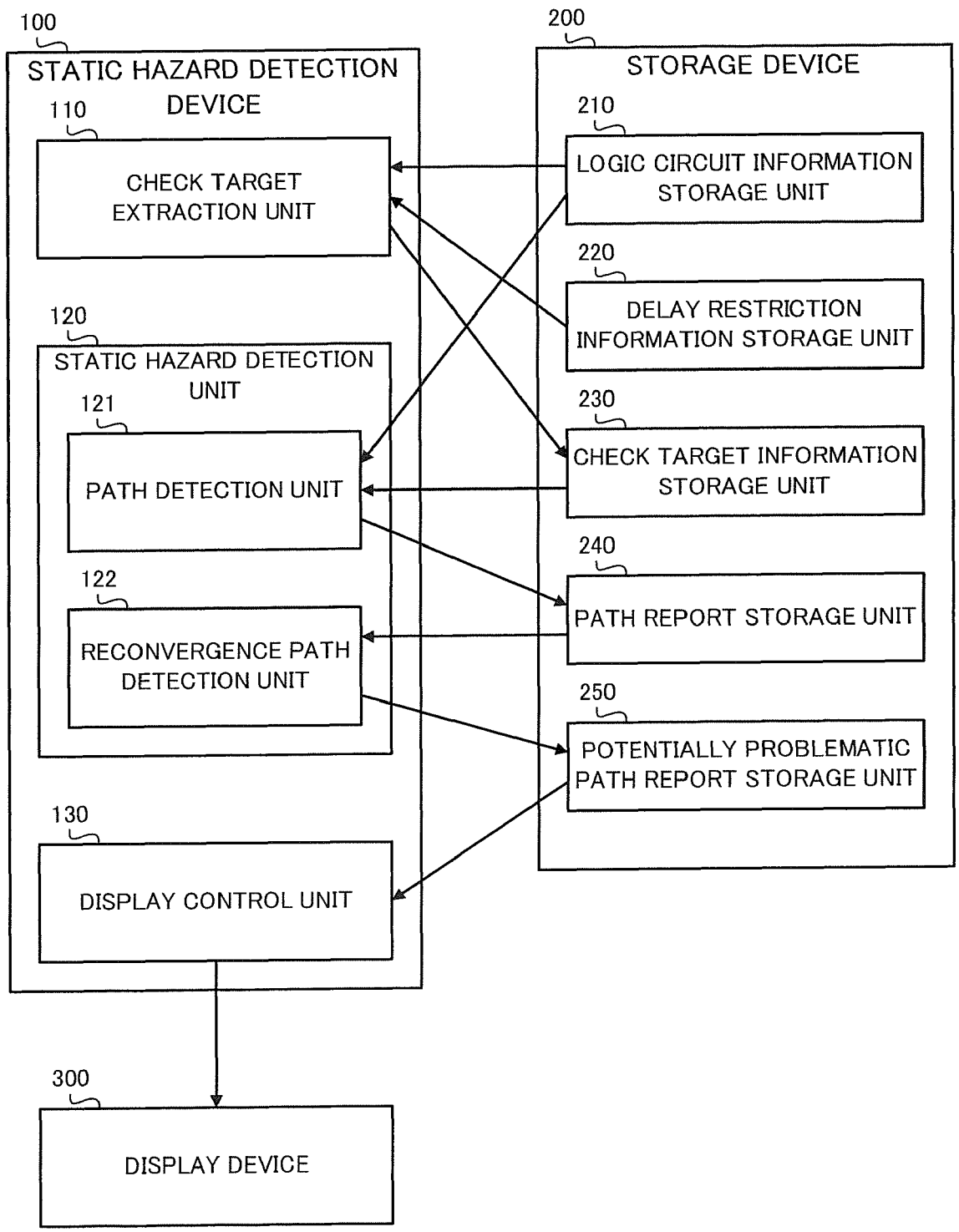
FIG. 2 is a block diagram explaining functions of the static hazard detection device 100 of the first to third embodiments of the present invention.

As shown in FIG. 2, the static hazard detection device 100 of this embodiment functionally includes a check target extraction unit 110, a static hazard detection unit 120, and a display control unit 130. The static hazard detection device 100 is a device that detects static hazards based on information stored in a storage device 200 and displays detection results at a display device 300.

As shown in FIG. 2, the storage device 200 includes a logic circuit information storage unit 210, a delay restriction information storage unit 220, a check target information storage unit 230, a path report storage unit 240, and a potentially problematic path report storage unit 250.

In this embodiment, explanation is given where the storage device 200 and the display device 300 are outside of the static hazard detection device 100 but it is also possible for the storage device 200 and the display device 300 to be included in the static hazard detection device 100. In this case, for example, the hard disk device 14 constitutes the storage device 200, and the display device 16 constitutes the display device 300.

The check target extraction unit 110 reads logic circuit information stored in the logic circuit information storage unit 210 and delay restriction information stored in the delay restriction information storage unit 220. The check target extraction unit 110 generates check target information based on the read-in logic circuit information and delay restriction information and stores the generated check target information in the check target information storage unit 230.

For example, as shown in FIG. 3A, check target information is information that correlates information indicating a register (referred to as "exception signal start point register" in the following) that is a start point for the exception signal, information indicating a register (referred to as "exception signal end point register" in the following) that is an end point for the exception signal, and information indicating a register (referred to as "control signal start point register" in the following) that is a start point for a control signal that controls propagation of the exception signal, every exception signal. The exception signal is a multi-cycle signal or asynchronous signal that is not propagated between registers within one clock signal period. The check target extraction unit 110 can be constituted by the CPU 11, or the like.

The static hazard detection unit 120 includes a path detection unit 121 and a reconvergence path detection unit 122. The static hazard detection unit 120 can be constituted by the CPU 11, or the like.

The path detection unit 121 reads in logic circuit information stored in the logic circuit information storage unit 210 and check target information stored in the check target information storage unit 230. The path detection unit 121 then generates a path report based on the read-in logic circuit information and the check target information and stores the generated path report in the path report storage unit 240.

For example, as shown in FIG. 3B, a path report is information correlating information indicating a path report number, information indicating an exception signal start point register, information indicating an exception signal end point register, and information indicating that a path between the exception signal start point register and the exception signal end point register is a path capable of propagating the exception signal when a state of the control signal that controls propagation of the exception signal is a state inhibiting propagation of the exception signal. An example is shown in FIG. 3B of an example for a path report for the case where no paths are detected between an exception signal start point register STRB_reg1 and an exception signal end point register END_reg1, one path is detected between an exception signal start point register STRB_reg2 and an exception signal end point register END_reg2, and two paths are detected between an exception signal start point register STRB_reg3 and an exception signal end point register END_reg3. The path detection unit 121 can be constituted by the CPU 11, or the like.

Specifically, the path detection unit 121 has functions such as in (1) to (3) in the following.

(1) A function for cutting a timing arc so that a state of a control signal that controls the exception signal is put to a state inhibiting propagation of the exception signal every exception signal (every combination of the exception signal start point register and the exception signal end point register included in the logic circuit).

Cutting the timing arc is ensuring that an output signal of an AND gate definitely becomes "0" and output of a signal from the other input terminal is not transmitted, by inputting, for example, "0" to one input terminal of the AND gate, i.e. by cutting the path at the AND gate.

(2) A function of searching for exception signal paths existing between the exception signal start point register and the exception signal end point register after cutting the timing arc.

In the best case where static hazards do not occur, a timing arc of the exception signal is cut by the control signal and a path is therefore not detected at all.

(3) A function for storing a path report including information indicating a path report number of a detected path, information indicating a register for a start point of the detected path, information indicating a register for an end point of the detected path, and information indicating the detected path in the path report storage unit 240.

The reconvergence path detection unit 122 reads in a path report stored in the path report storage unit 240. The reconvergence path detection unit 122 then generates a report for a potentially problematic path based on the read-in path report and stores the generated report for a potentially problematic path in the potentially problematic path report storage unit 250. The reconvergence path detection unit 122 can be constituted by the CPU 11, or the like.

As shown, for example, in FIG. 3C, the report for a potentially problematic path is information correlating information indicating a plurality of path report numbers indicating a plurality of respective paths common to the exception signal start point register and the exception signal end point register, information indicating the start point register for the plurality of paths, and information indicating the end point register for the plurality of paths. An example of a report for a potentially problematic path when a plurality of paths are detected only between the exception signal start point register STRB_reg3 and the exception signal end point register END_reg3 is shown in FIG. 3C.

The exception signal end point register indicated by the report for a potentially problematic path therefore constitutes a location where the occurrence of a static hazard is possible. The basic cause of a static hazard is a glitch. It is possible for glitches to occur only on a reconvergence path. The exception signal end point register indicated by the report for a potentially problematic path therefore constitutes a portion where the occurrence of a static hazard is possible. When a report for a potentially problematic path is outputted, there is a possibility of a static hazard occurring and the designer therefore performs a detailed analysis. However, this operation is straightforward because the portion that is the target of analysis is narrowed down by the report for a potentially problematic path.

The display control unit 130 displays the content of the potentially problematic path report storage unit 250 at the display device 300. The display control unit 130 can be constituted by the CPU 11, or the like.

Logic circuit information (netlist) indicating logic circuits that are the target of checking is stored in the logic circuit information storage unit 210. The logic circuit information is generated, for example, as the result of a Register Transfer Language (RTL) being logic synthesized by logic synthesis tools (not shown).

Commands relating to delay restrictions provided to the logic synthesis tool while generating the logic circuit information or the like are stored in the delay restriction information storage unit 220.

Check target information is stored in the check target information storage unit 230.

Path reports are stored in the path report storage unit 240.

Information indicating a path where there is a possibility of a static hazard occurring is stored as a report for a potentially problematic path in the potentially problematic path report storage unit 240.

The static hazard detection device 100 can be implemented using a computer, with, for example, the following being adopted when this is the case. A disk, semiconductor memory, or other recording medium recorded with a program enabling a computer to function as the static hazard detection device 100 is prepared and the program is read into the computer. The computer then implements, on the computer itself, the check target extraction unit 110, the static hazard detection unit 120, and the display control unit 130 by controlling its own operations in accordance with the read program.

Next, an explanation is given of the details of the operation of the static hazard detection device 100 of this embodiment. First, an explanation is given of check target extraction processing executed by the check target extraction unit 110 with reference to the flowchart of FIG. 4. First, an explanation is given of the case where the logic circuit information stored in the logic circuit information storage unit 210 represents the logic circuit shown in FIG. 5. A straightforward explanation of the logic circuit shown in FIG. 5 is now given.

Figure 5:
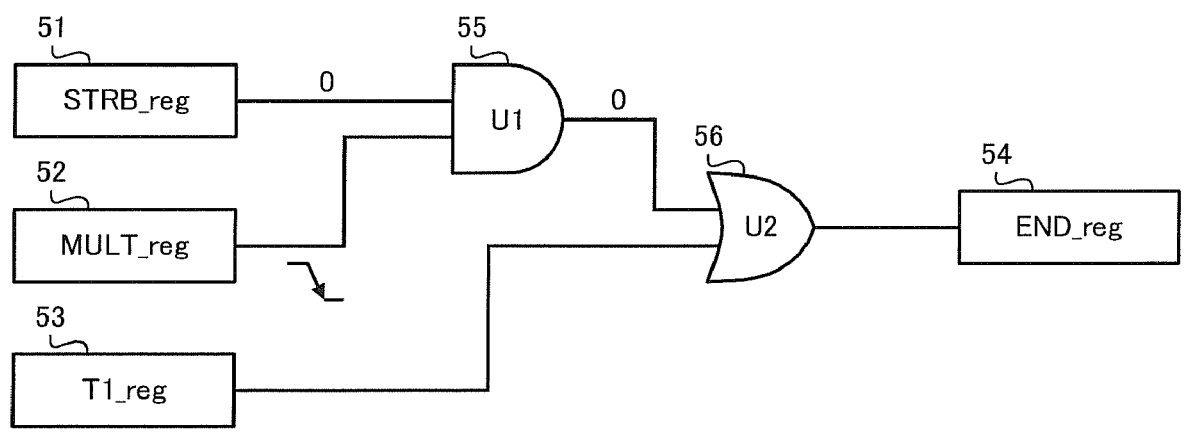
FIG. 5 is a view showing a first example of a logic circuit that is made a check target.

The logic circuit depicted in FIG. 5 includes a register 51, a register 52, a register 53, a register 54, an AND gate 55, and an OR gate 56.

The register 51 is a register storing information indicating a signal level of the control signal, i.e. the control signal start point register. The register 51 in FIG. 5 is described as STRB_reg.

The register 52 is a register storing information indicating an exception signal signal level, i.e. the exception signal start point register. The register 52 in FIG. 5 is described as MULT_reg.

The register 53 is a register that stores information indicating the level of the signal supplied to the register 54 when the signal level of the control signal is a signal level that inhibits propagation of the exception signal. The register 53 in FIG. 5 is described as T1_reg.

The register 54 is a register storing information indicating an exception signal signal level when propagation of the exception signal is not inhibited, i.e. the exception signal end point register. The register 54 in FIG. 5. is described as END_reg.

The AND gate 55 is a logic circuit that takes the logical product of the signal level of the control signal supplied by the register 51 and the signal level of the exception signal supplied by the register 52. The AND gate 55 in FIG. 5 is described as U1.

The OR gate 56 is a logic circuit taking the logical sum of the signal level of the signal supplied by the AND gate 55 and the signal level of the signal supplied by the register 53. The OR gate 56 in FIG. 5 is described as U2.

Figure 6:
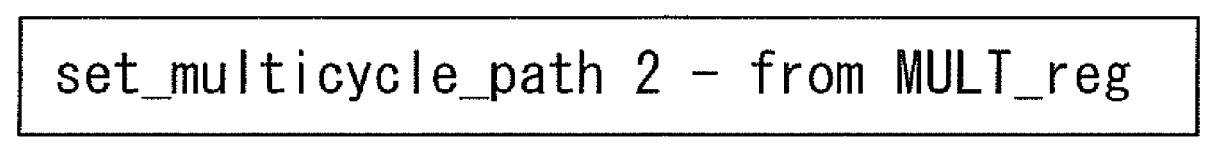

An explanation of the flowchart shown in FIG. 4 is now returned to. First, the check target extraction unit 110 reads in logic circuit information from the logic circuit information storage unit 210 and reads in delay restriction information from the delay restriction information storage unit 220 (step S101). An example of the delay restriction information read in at this time is shown in FIG. 6. The delay restriction information shown in FIG. 6 means that paths from the register MULT_reg to the register of the next stage are all synthesized with a delay of a two-clock signal period.

Next, the check target extraction unit 110 extracts all of the exception signal start point registers and the control signal start point registers (step S102). Specifically, the check target extraction unit 110 compares the logic circuit information and naming rules (the deciding that STRB_* (where "*" is an arbitrary alphanumeric character) refers to a control signal start point register) decided in advance and extracts all of the control signal start point registers within the logic circuit. Namely, the check target extraction unit 110 extracts all of registers with the names "STRB_*" from the logic circuit information. In the example shown in FIG. 5, the register 51 (STRB_reg) is extracted as the control signal start point register.

Further, the check target extraction unit 110 extracts all of the exception signal start point registers within the logic circuits based on the delay restriction information. Namely, the check target extraction unit 110 extracts all of start point registers where a delay restriction is defined in the delay restriction information from the logic circuit information. In the example shown in FIG. 6, it can be seen from "set_multicycle_path 2—from MULT_reg" that MULT reg is the exception signal start point register. MULT reg (register 52 in FIG. 5) is therefore extracted as the exception signal start point register. In the design stage, the designer defines the control signal start point register in accordance with the naming conventions described above, and defines delay restrictions for the exception signal using the exception signal start point register.

The check target extraction unit 110 then determines whether or not selection of all of the exception signal start point registers is complete (step S103). The check target extraction unit 110 then ends check target extraction processing when it is determined that selection of all of the exception signal start point registers is complete (step S103: Yes).

On the other hand, when it is determined that selection is not complete for any of the exception signal start point registers (step S103: No), the check target extraction unit 110 selects one exception signal start point register (step S104). The check target extraction unit 110 then performs a fan-out-trace for up to the register of the next stage for the selected exception signal start point register (step S105).

The check target extraction unit 110 then determines whether or not selection of all of the control signal start point registers is complete (step S106). The check target extraction unit 110 then returns to the processing of step S103 when it is determined that selection of all of the control signal start point registers is completed (step S106: Yes).

On the other hand, when it is determined that any of the control signal start point registers have not been selected (step S106: No), the check target extraction unit 110 selects one control signal start point register (step S107). The check target extraction unit 110 then performs a fan-out-trace for up to the register of the next stage for the selected control signal start point register (step S108).

After this, the check target extraction unit 110 determines whether or not a register for the next stage obtained by using a fan-out-trace in step S105 and a register for the next stage obtained by using a fan-out-trace in step S108 match (step S109). Namely, the check target extraction unit 110 determines whether or not the selected exception signal (the exception signal taking the exception signal start point register selected in step S104 as a start point) and the selected control signal (the control signal taking the control signal start point register selected in step S107 as a start point) are included in the same register. When it is determined that the registers for the next stage do not match (step S109: No), the check target extraction unit 110 returns to the processing of step S106. When the registers for the next stage do match (step S109: Yes), the check target information is stored in the check target information storage unit 230 (step S110).

Namely, when the registers for the next stage match, the register for the next stage is an exception signal end point register. The check target extraction unit 110 therefore stores check target information including information indicating the exception signal start point register selected in step S104, information indicating the exception signal end point register, and information indicating the control signal start point register selected in step S107 in the check target information storage unit 230. The check target extraction unit 110 then returns to the processing in step S103 after storing the check target information in the check target information storage unit 230.

The check target extraction unit 110 repeatedly executes the processing described above (step S103 to step S110) until it is determined that all of the exception signal start point registers have been selected (step S103: Yes).

Figure 7:
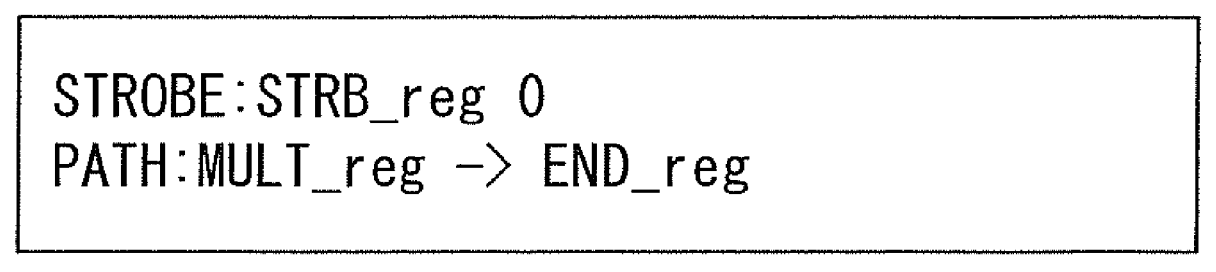

When the register 52 (MULT_reg) is selected as the exception signal start point register in step S104, and the register 51 (STRB_reg) is selected as the control signal start point register in step S107, the registers (register 54 (END_reg)) for the next stage match (step S109: Yes). As shown in FIG. 7, as a result, the check target extraction unit 110 stores check target information including information indicating that the exception signal start point register is MULT_reg, information indicating that the exception signal end point register is END_reg, and information indicating that the control signal start point register that controls the exception signal is STRB_reg in the check target information storage unit 230.

Figure 8:
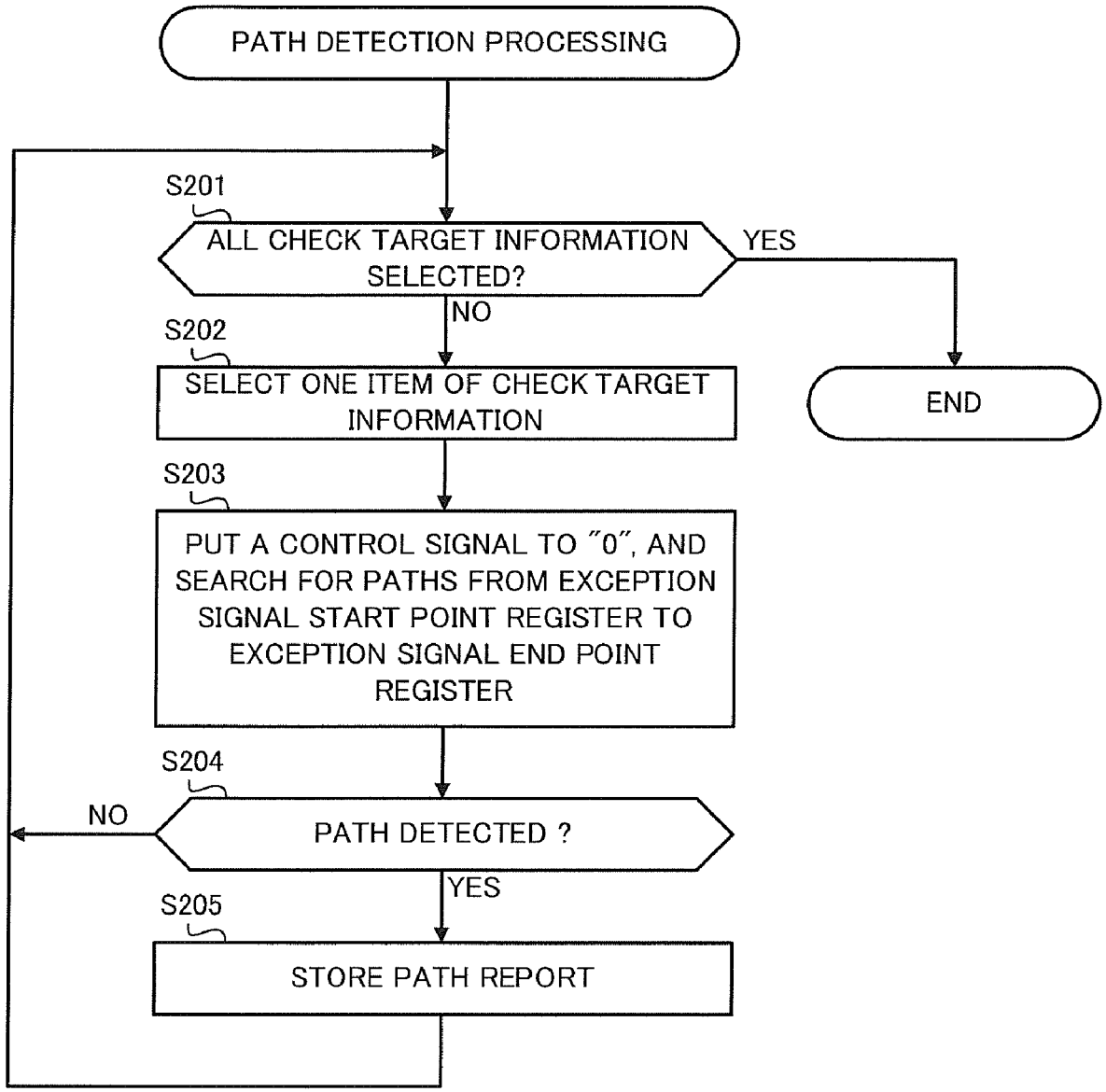
FIG. 8 is an example of a flowchart showing path detection processing.

When the check target extraction unit 110 ends the check target extraction processing, the path detection unit 121 carries out the path detection processing shown in the flowchart of FIG. 8.

First, the path detection unit 121 determines whether or not all of the check target information stored in the check target information storage unit 230 has been selected (step S201). When the path detection unit 121 determines that all of the check target information has been selected (step S201: Yes), the path detection processing ends. On the other hand, when the path detection unit 121 determines that any of the items of check target information have not been selected (step S201: No), one item of check target information is selected (step S202).

Next, the path detection unit 121 puts the signal level of the control signal displayed in the selected check target information to "0", and searches for a path from the exception signal start point register displayed by the check target information to the exception signal end point register displayed by the check target information (step S203). When a path cannot be detected (step S203: No), the path detection unit 121 returns to the processing of step S201. On the other hand, when a path can be detected (step S204: Yes), the path detection unit 121 stores a path report indicating the detected path in the path report storage unit 240 (step S205). The path report includes information indicating a path report number, information indicating an exception signal start point register, information indicating an exception signal end point register, and information indicating logic elements present within the path. The path detection unit 121 then returns to the processing of step S201 after storing the path report to the path report storage unit 240.

The path detection unit 121 then repeatedly executes the processing described above (step S201 to step S205) until it is determined that all of the check target information has been selected (step S201: Yes).

The check target information shown in FIG. 7 is stored in the check target information storage unit 230 when the circuit indicated in the logic circuit information stored in the logic circuit information storage unit 210 is the circuit shown in FIG. 5. The path detection unit 121 fixes the signal level of the control signal outputted by the control signal start point register STRB_reg (register 51) to "0", and searches for paths from the exception signal start point register MULT_reg (register 52) to the exception signal end point register END_reg (register 54). However, the timing arc is cut at the portion U1 (AND gate 55) because the control signal is "0" (so that the output is always "0" when one input of the AND gate is "0"). A path report is therefore never stored in the path report storage unit 240 in this example.

Figure 9:
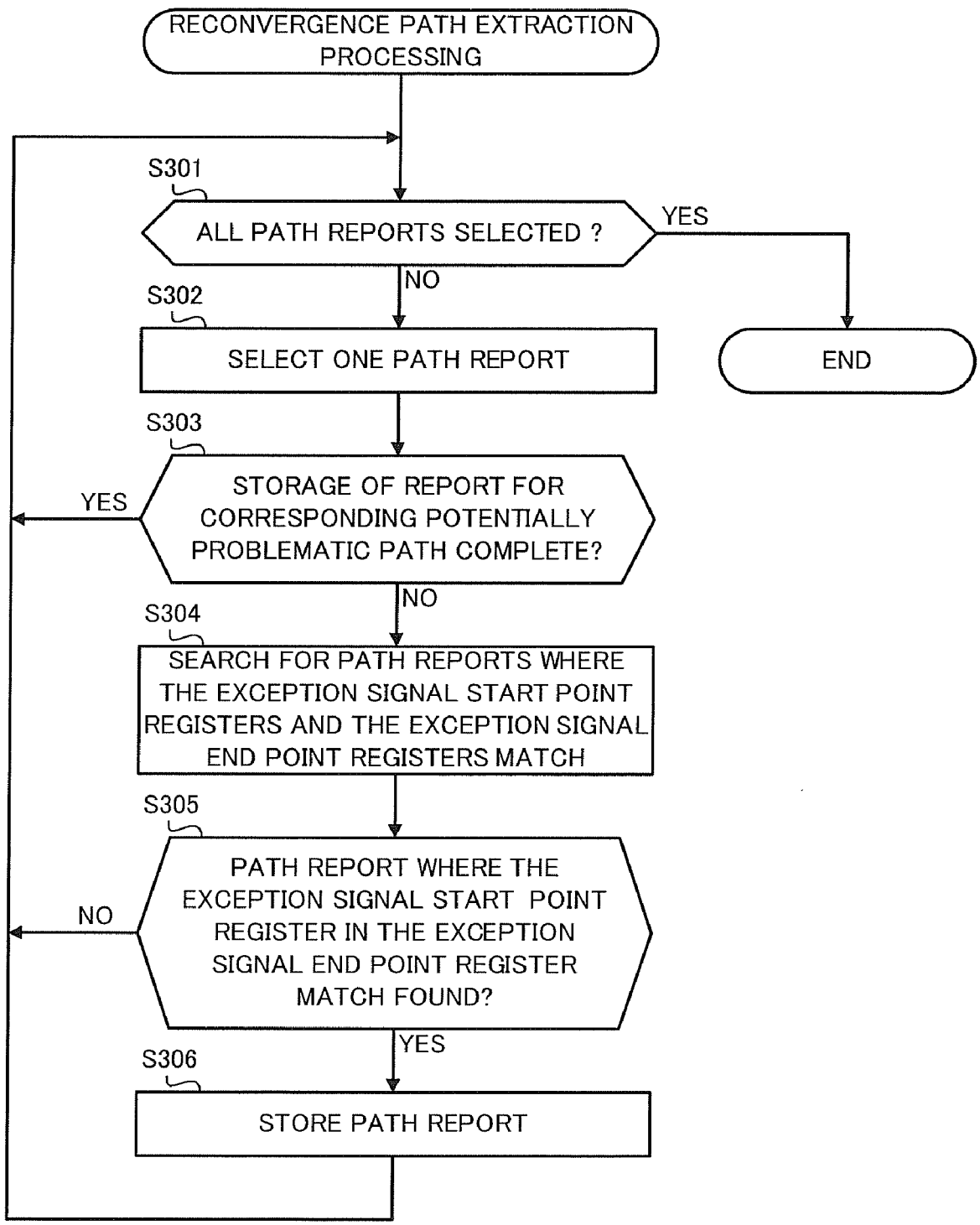
FIG. 9 is an example of a flowchart showing reconvergence path extraction processing.

When the path detection unit 121 completes the path detection processing, the reconvergence path detection unit 122 carries out the reconvergence path extraction processing shown in the flowchart of FIG. 9.

The reconvergence path detection unit 122 then determines whether or not all of the path reports stored in the path report storage unit 240 have been selected (step S301). The reconvergence path extraction processing is then ended when the reconvergence path detection unit 122 determines that all of the path reports have been selected (step S301: Yes). On the other hand, when it is determined that any of the path reports have not yet been selected (step S301: No), the reconvergence path detection unit 122 selects one path report (step S302).

Next, the reconvergence path detection unit 122 determines whether or not a report for a potentially problematic path including information indicating the exception signal start point register and information indicating the exception signal end point register is stored in the potentially problematic path report storage unit 250 by searching reports in the potentially problematic path report storage unit 250 taking information indicating the exception signal start point register included in the selected path report and information indicating the exception signal end point register included in the selected path report as a key (step S303).

When the reconvergence path detection unit 122 determines that the corresponding reports for potentially problematic paths have been stored (step S303: Yes), the processing returns to step S301. On the other hand, when it is determined that storage of the corresponding report for a potentially problematic path is not completed (step S303: No), the reconvergence path detection unit 122 searches for a path report where the exception signal start point register and the exception signal end point register match by searching the path report storage unit 240 taking information indicating the exception signal start point register included in the selected path report and information indicating the exception signal end point register included in the selected path report as a key (step S304).

When a path report where the exception signal start point register and the exception signal end point register match with the path report selected in step S302 cannot be detected (step S305: No), the reconvergence path detection unit 122 returns to the processing of step S301. When a path report where the exception signal start point register and the exception signal end point register match with the path report selected in step S302 can be detected (step S305: Yes), the reconvergence path detection unit 122 stores the report for a potentially problematic path in the potentially problematic path report storage unit 250 (step S306). A potentially problematic path report includes, for example, information indicating the path report number contained in the path report selected in step S302 and the path report number included in the path report detected in step S304, information indicating the exception signal start point register contained in these path reports, and information indicating the exception signal end point register included in these path reports. On the other hand, the reconvergence path detection unit 122 then returns to the processing of step S301 after storing the report for a potentially problematic path in the potentially problematic path report storage unit 250.

The reconvergence path detection unit 122 then repeatedly executes the processing described above (step S301 to step S306) until it is determined that all of the reports for potentially problematic paths have been selected (step S301: Yes).

In this example, path reports are not stored in the path report storage unit 240 at all. The storing of reports for potentially problematic paths in the potentially problematic path report storage unit 250 by the reconvergence path detection unit 122 will therefore not occur.

When processing by the reconvergence path detection unit 122 is complete, the display control unit 130 displays the report for a potentially problematic path stored in the potentially problematic path report storage unit 250 at the display device 300. When reports for potentially problematic paths are not stored in the potentially problematic path report storage unit 250 at all, the display control unit 130 displays a message to the effect that there is no possibility of a static hazard occurring at the display device 300.

Figure 10:
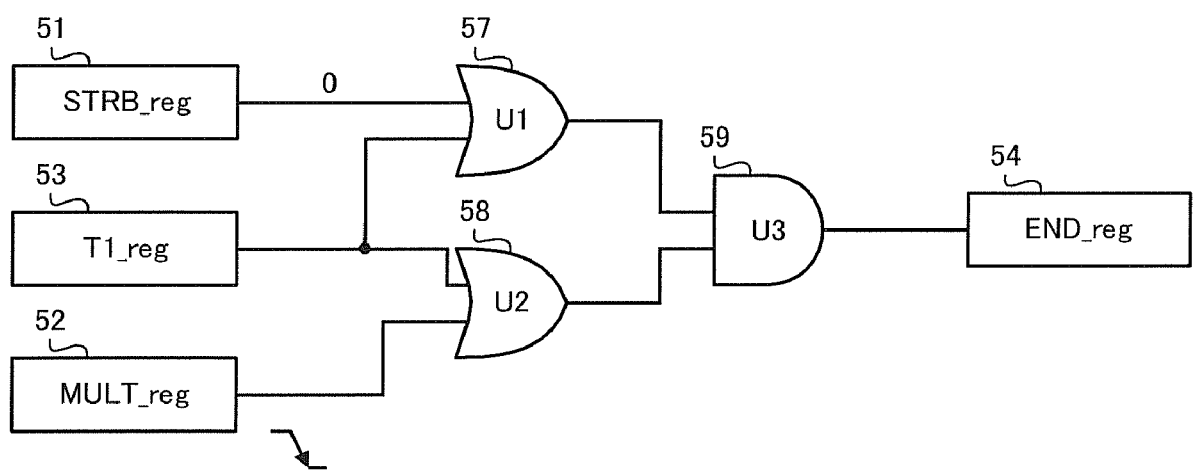
FIG. 10 is a view showing a second example of a logic circuit that is made a check target.

Next, an explanation is given of the operation giving an example of the case where the logic circuit (check target logic circuit) described by the logic circuit information stored in the logic circuit information storage unit 210 is as shown in FIG. 10. A brief explanation of the logic circuit shown in FIG. 10 is now given.

The logic circuit shown in FIG. 10 includes the register 51, the register 52, the register 53, the register 54, an OR gate 57, an OR gate 58, and an AND gate 59. Elements of the configuration that are the same as for the logic circuit shown in FIG. 5 (elements of the configuration assigned with the same numerals) are not described.

The OR gate 57 is a logic circuit taking the logical sum of the signal level of the control signal supplied by the register 51 and the signal level of the signal supplied by the register 53. The OR gate 57 in FIG. 10 is described as U1.

The OR gate 58 is a logic circuit taking the logical sum of the signal level of the signal supplied by the register 53 and the signal level of the exception signal supplied by the register 52. The OR gate 58 in FIG. 10. is described as U2.

The AND gate 59 is a logic circuit taking a logical product of the signal level of the signal supplied by the OR gate 57 and the signal level of the signal supplied by the OR gate 58. The AND gate 59 is described as U3 in FIG. 10.

First, the check target extraction unit 110 carries out the check target extraction processing shown in the flowchart of FIG. 4. In the case of this example, when the register 52 (MULT_reg) is selected in step S104 and the register 51 (STRB_reg) is selected in step S107, the registers of the next stage both become register 54 (END_reg) (step S109: Yes). The check target extraction unit 110 then stores the check target information shown in FIG. 7 in the check target information storage unit 230 (step S110). Namely, the check target extraction unit 110 stores check target information including information indicating the exception signal start point register MULT_reg, information indicating the exception signal end point register END_reg, and information indicating the control signal start point register STRB_reg that controls the exception signal in the check target information storage unit 230.

When the check target extraction unit 110 ends the check target extraction processing, the path detection unit 121 carries out the path detection processing shown in the flowchart of FIG. 8.

In the case of this example, in step S203, U1 is an OR gate so even if the control signal outputted by the start point register STRB reg is fixed to "0", fixed propagation will not occur. This is because the output value of the OR gate depends on the other signal value even when one input signal is "0". When a path from the exception signal start point register MULT_reg to the exception signal end point register END_reg is searched in a state where the control signal is fixed at "0", a path of exception signal start point register MULT_reg→OR gate U2→AND gate U3→exception signal end point register END reg is detected. This means that, in the case of this example, the path detection unit 121 stores a path report including information indicating a path report number Path#1, information indicating an exception signal start point register MULT_reg, information indicating an exception signal end point register END_reg, and information indicating "MULT_reg, U2, U3, END_reg" indicating the detected path in the path report storage unit 240, as shown in FIG. 11.

When the path detection unit 121 completes the path detection processing, the reconvergence path detection unit 122 carries out the reconvergence path extraction processing shown in the flowchart of FIG. 9.

In the case of this example, only one path report is stored in the path report storage unit 240 as shown in FIG. 11. A situation where the reconvergence path detection unit 122 stores a report for a potentially problematic path in the potentially problematic path report storage unit 250 therefore does not occur.

When the reconvergence path detection unit 122 completes the reconvergence path extraction processing, the display control unit 130 displays the report for a potentially problematic path stored in the potentially problematic path report storage unit 250 at the display device 300. The case of this example, reports for a potentially problematic paths are not stored at all in the potentially problematic path report storage unit 250. The display control unit 130 therefore displays a message to the effect that static hazards will not occur at the display device 300. In reality, with the logic circuit shown in FIG. 10, the exception signal outputted by the register 52 (MULT_reg) is not propagated to the register 54 (END_reg) if the signal level of the control signal outputted by the register 51 (STRB_reg) is "0" regardless of whether the signal level of a one clock signal period signal outputted by the register 53 (T1 reg) is "1" or "0".

Figure 12:
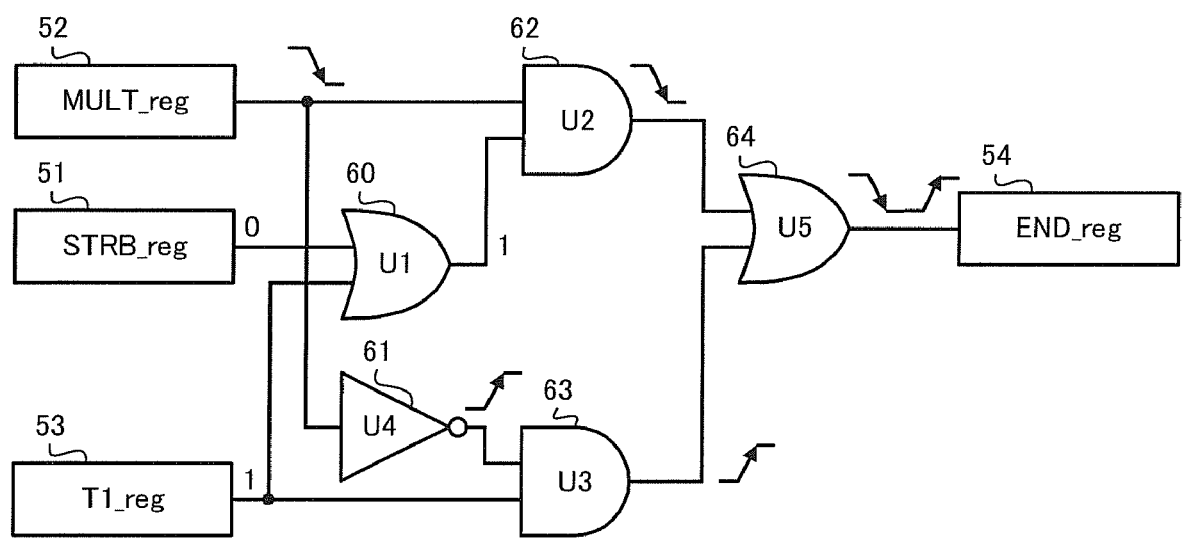
FIG. 12 is a view showing a third example of a logic circuit that is made a check target.

Next, an explanation is given of the operation giving an example of the case where the logic circuit (logic circuit that is the check target) described by the logic circuit information stored in the logic circuit information storage unit 210 is as shown in FIG. 12. A brief explanation of the logic circuit shown in FIG. 12 is now given.

The logic circuit shown in FIG. 10 includes the register 51, the register 52, the register 53, the register 54, an OR gate 60, an inverter 61, an AND gate 62, an AND gate 63, and an OR gate 64. Elements of the configuration that are the same as for the logic circuit shown in FIG. 5 (elements of the configuration assigned with the same numerals) are not described.

The OR gate 60 is a logic circuit taking the logical sum of the signal level of the control signal supplied by the register 51 and the signal level of the signal supplied by the register 53. The OR gate 60 in FIG. 12 is described as U1.

The inverter 61 is a logic circuit that inverts and outputs the signal level of the exception signal supplied by the register 52. The inverter 61 in FIG. 12 is described as U4.

The AND gate 62 is a logic circuit that takes the logical product of the signal level of the exception signal supplied by the register 52 and a signal level of the signal supplied by the OR gate 60. The AND gate 62 is described as U2 in FIG. 12.

The AND gate 63 is a logic circuit that takes a logical product of the signal level of the signal supplied by the inverter 61 and the signal level of the signal supplied by the register 53. The AND gate 63 is described as U3 in FIG. 12.

The OR gate 64 is a logical circuit taking the logical sum of the signal level of the signal supplied by the AND gate 62 and the signal level of the signal supplied by the AND gate 63. The OR gate 64 in FIG. 12 is described as U5.

Here, the principle of appearance of a static hazard in the relationship between the exception signal and the control signal is described in detail with reference to FIGS. 5 and 12.

As shown in FIG. 5, the designer then provides a control signal that controls whether or not data from the exception signal is taken in, and performs RTL description so as to create a circuit where data is not taken in from the exception signal when the control signal is "0" and where conversely, data is taken in from the exception signal when the control signal is "1". In the circuit shown in FIG. 5, the design is such that change in the exception signal is not propagated to the register END_reg when the control signal is "0".

However, even with RTL written with this kind of intention, there is the possibility that a circuit such as in FIG. 12 will be created as the result of optimization processing while the logic synthesis tool converts from RTL to gate level. Logically speaking, this circuit is the equivalent to FIG. 5, however there is the possibility of glitches occurring. Namely, when one clock signal period signal is "1", there is the possibility of a glitch occurring because the exception signal propagates using two paths, a path of exception signal start point register MULT_reg→AND gate U2→OR gate U5→exception signal end point register END_reg, and a path of exception signal start point register MULT_reg→inverter U4→AND gate U3→OR gate U5→exception signal end point register END_reg. A logic error operation (static hazard) therefore occurs on the rising edge of the clock signal of the register END_reg when a glitch occurs.

An explanation of the operation of the static hazard detection device 100 is now returned to. First, the check target extraction unit 110 carries out the check target extraction processing shown in the flowchart of FIG. 4. In the case of this example, the exception signal start point register MULT_reg is selected in step S104 and the registers of the next stage match (step S109: Yes) when and the control signal start point register STRB_reg is selected in step S107. The check target extraction unit 110 therefore stores the check target information shown in FIG. 7 in the check target information storage unit 230 (step S110). Namely, the check target extraction unit 110 stores check target information including information indicating the exception signal start point register MULT_reg, information indicating the exception signal end point register END_reg, and information indicating the control signal start point register STRB_reg that controls the exception signal in the check target information storage unit 230.

When the check target extraction unit 110 ends the check target extraction processing, the path detection unit 121 carries out the path detection processing shown in the flowchart of FIG. 8.

In the case of this example, in step S203, the control signal is inputted to the OR gate U1 even if the control signal outputted by the start point register STRB_reg is fixed to "0". Fixed propagation thereafter therefore does not arise for the reasons described above. Two paths, a path of exception signal start point register MULT_reg→AND gate U2→OR gate U5→exception signal end point register END_reg, and a path of exception signal start point register MULT_reg→inverter U4→AND gate U3→OR gate U5→exception signal end point register END_reg can then be detected when the control signal is fixed to "0" and paths from the exception signal start point register MULT_reg to the exception signal end point register END_reg are searched for.

The path detection unit 121 then stores path reports for the two detected paths in the path report storage unit 240 (step S205). Specifically, as shown in FIG. 13, a path report including a path report number Path #1, information indicating an exception signal start point register MULT_reg, information indicating an exception signal end point register END_reg, and information indicating the path "MULT_reg, U2, U5, END_reg" is stored as a path report for the path "exception signal start point register MULT_reg→AND gate U2→OR gate U5→exception signal end point register END_reg" and a path report including a path report number Path #2, information indicating the exception signal start point register MULT_reg, information indicating the end point register END_reg, and information indicating the path "MULT_reg, U4, U3, U5, END_reg" is stored as a path report for the path "exception signal start point register MULT_reg→inverter U4→AND gate U3→OR gate U5→exception signal end point register END_reg".

When the path detection unit 121 completes the path detection processing, the reconvergence path detection unit 122 carries out the reconvergence path extraction processing shown in the flowchart of FIG. 9.

In the case of this example, as shown in FIG. 13, two path reports of the path report of path report number Path #1 and the path report of path report number Path #2 are stored in the path report storage unit 240. The following processing is therefore carried out.

Figure 14:
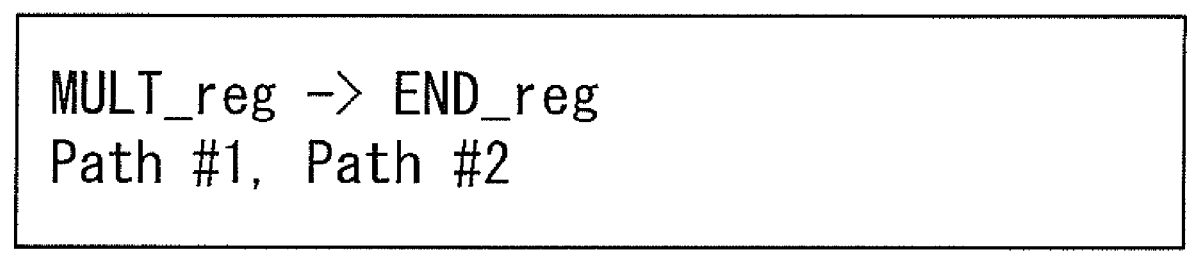

First, the reconvergence path detection unit 122 selects the path report of path report number Path #1 (step S302). The reconvergence path detection unit 122 then searches the path report storage unit 240 taking information indicating the exception signal start point register MULT_reg and information indicating the exception signal end point register END_reg included in the path report as a search key (step S304). In the case of this example, the path report of path report number Path #2 is such that the exception signal start point register and the exception signal end point register match with that of the path report of path report number Path #1 (step S305: Yes). The reconvergence path detection unit 122 then stores a report for a potentially problematic path in the potentially problematic path report storage unit 250 (step S306). Specifically, as shown in FIG. 14, the reconvergence path detection unit 122 stores the report for a potentially problematic path including information indicating the exception signal start point register MULT_reg, information indicating the exception signal end point register END_reg, and information indicating the path report numbers Path #1 and Path #2 of the detected path report in the potentially problematic path report storage unit 250.

When the reconvergence path detection unit 122 completes the reconvergence path extraction processing, the display control unit 130 displays the report for a potentially problematic path stored in the potentially problematic path report storage unit 250 at the display device 300. It is therefore possible for the designer to be aware that the possibility of a static hazard occurring at the exception signal end point register END_reg is high by looking at this display. The format of the report for a potentially problematic path is by no means limited to the format shown in FIG. 14. For example, the format of the report for a potentially problematic path may also include only the exception signal end point register and may include information indicating the path in addition to the information shown in FIG. 14. It is therefore possible for the designer to easily be aware of the possibility of the occurrence of a static hazard that is caused by which path by including information indicating the path in the report for a potentially problematic path.

Although this is not explained in the embodiments above, it is also possible to utilize a Static Timing Analyzer (STA) as the path detection unit 121. When a static timing analyzer is utilized as the path detection unit 121, it is necessary to convert check target information into commands for dedicated use with a static timing analyzer as shown in FIG. 15 while the check target extraction unit 110 stores the check target information in the check target information storage unit 230. Here, "set_case_analysis" is the command for fixing a register to a constant. Further, "report timing" is a command for reporting a path between designated registers. This means that STRB_reg is set to "0", and a path from MULT_reg to END_reg is outputted. The operation of the static timing analyzer is substantially the same as the operation of the path detection unit 121 shown in the flowchart of FIG. 8. A point of distinction, however, is that commands for dedicated use with the static timing analyzer are inputted in place of the check target information.

According to the static hazard detection device 100 of this embodiment, it is possible to automatically check as to whether or not static hazards are possible to occur even for logic circuits where a control signal for controlling propagation of exception signals is introduced.

The reason for this is because the static hazard detection device 100 is provided with the static hazard detection unit 120 that detects end point registers having a plurality of paths where propagation of the exception signal is possible between the exception signal start point registers when the state of the control signal is a state that inhibits propagation of the exception signals, for exception signal end point registers within the logic circuit.

According to this embodiment, it is possible for portions where the likelihood of the static hazard occurring is high to be easily recognized by a designer.

This is because the display control unit 130 displays information indicating the exception signal end point registers detected by the static hazard detection unit 120 at the display device 300.

Second Embodiment

In the first embodiment, an example is given where control signal start point registers existing within the logic circuit are extracted based on information designated by the designer in advance (symbols for control signal start point registers named by the designer according to prescribed naming rules). However, a structure is also possible where control signal start point registers existing within the logic circuit are extracted without using information provided expressly by the designer. The following is an explanation with reference to the drawings of the operation of the static hazard detection device 100 of a second embodiment of the present invention. With the exception processing of the extraction of the check targets, the operation of the static hazard detection device 100 of the second embodiment is the same as the operation of the static hazard detection device 100 of the first embodiment. The following is an explanation of check target extraction processing executed by the static hazard detection device 100 of the second embodiment.

Figure 16:
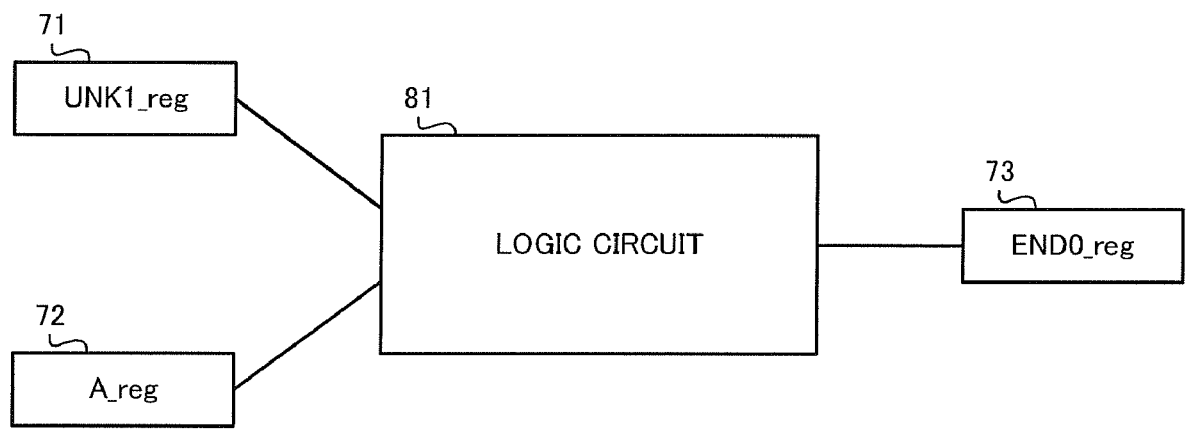
FIG. 16 is a view showing an example of a logic circuit made the target of a check in the second embodiment.

Here, an explanation is given of the case where the logic circuit information stored in the logic circuit information storage unit 210 denotes the logic circuit shown in FIG. 16. A brief explanation of the logic circuit shown in FIG. 16 is now given.

The logic circuit shown in FIG. 16 includes a register 71, a register 72, a register 73, and a logic circuit 81.

The register 71 is a register storing information indicating an exception signal signal level, i.e. the exception signal start point register. The register 71 in FIG. 16 is described as UNK1_reg.

The register 72 is a register storing information indicating a signal level of a control signal, i.e. a control signal start point register. The register 72 in FIG. 16 is described as A_reg.

The register 73 is a register storing information indicating an exception signal signal level when propagation of the exception signal is not inhibited, i.e. an exception signal end point register. The register 73 in FIG. 16 is described as ENDO_reg.

The logic circuit 81 is a circuit including AND gates, OR gates, and inverters or the like. An exception signal is propagated to the register 73 from the register 71 via the logic circuit 81.

Figure 17:
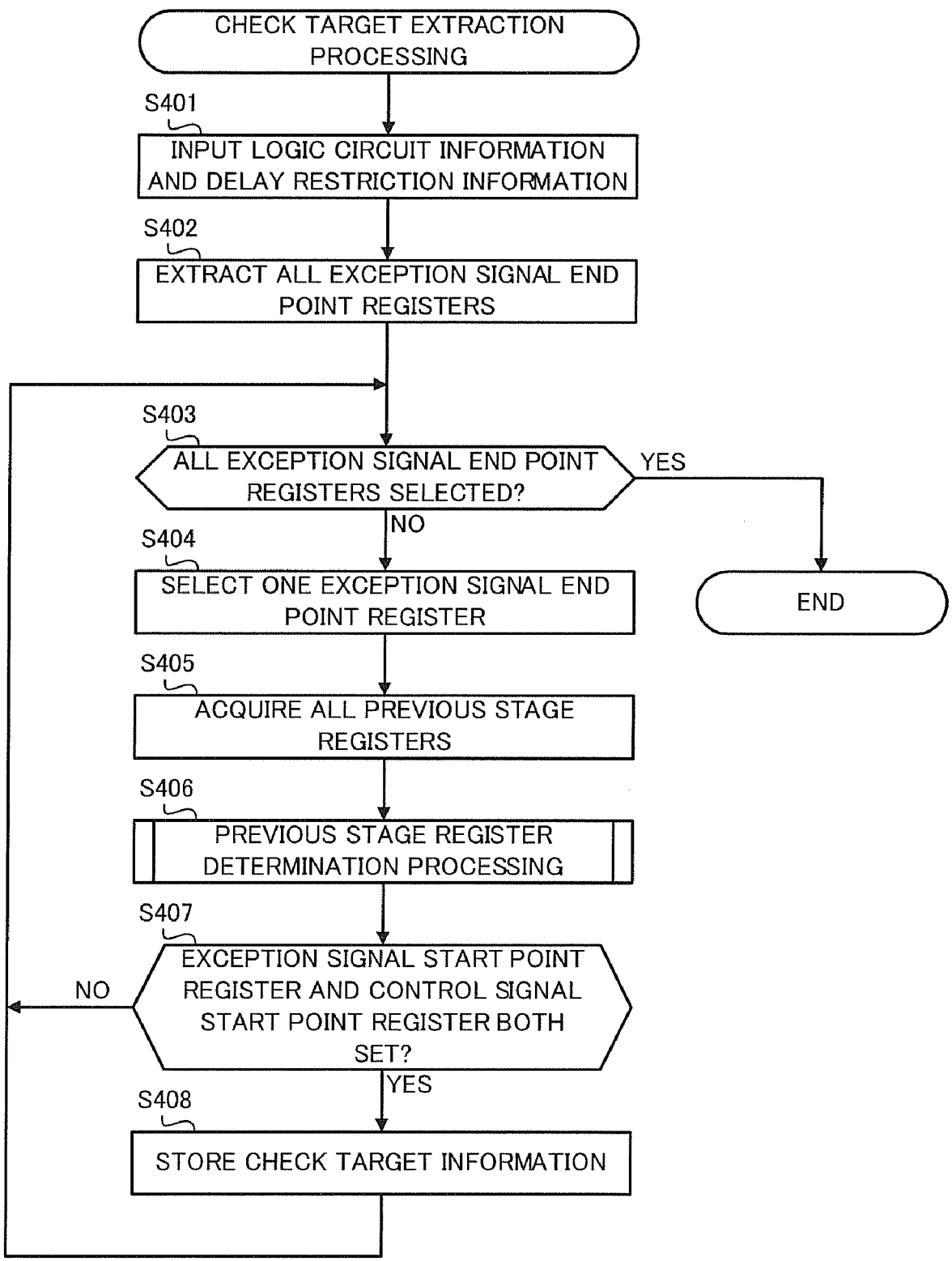
FIG. 17 is an example of a flowchart showing check target extraction processing of the second embodiment.

Next, an explanation is given of check target extraction processing executed by the check target extraction unit 110 with reference to the flowchart in FIG. 17.

Figure 19:
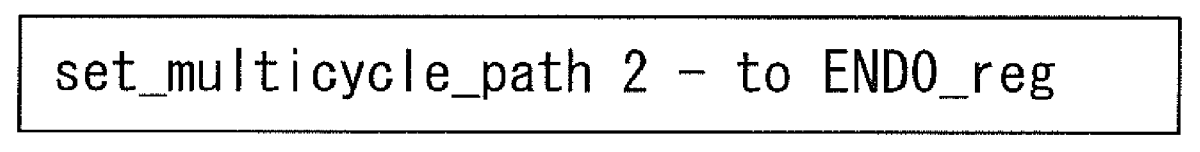

First, the check target extraction unit 110 reads in logic circuit information from the logic circuit information storage unit 210 and reads in delay restriction information from the delay restriction information storage unit 220 (step S401). An example of the delay restriction information read in at this time is shown in FIG. 19. The delay restriction information shown in FIG. 19 means that paths from the register of the previous stage to the register END0_reg are all synthesized using a delay of two clock signal periods.

Next, the check target extraction unit 110 extracts all of the exception signal end point registers (step S402). Specifically, the check target extraction unit 110 extracts all of the exception signal end point registers within the logic circuit based on the delay restriction information. Namely, the check target extraction unit 110 extracts all of end point registers where a delay restriction is defined in the delay restriction information from the logic circuit information. In the example shown in FIG. 19, ENDO_reg is the exception signal end point register because "set_multicycle_path 2—to ENDO_reg" is shown. This means that ENDO_reg (register 73 in FIG. 16) is extracted as the exception signal end point register. In the design stage, the designer defines delay restrictions for the exception signal using the exception signal end point register.

The check target extraction unit 110 then determines whether or not selection of all of the exception signal end point registers is complete (step S403). The check target extraction unit 110 then ends check target extraction processing when it is determined that selection of all of the exception signal end point registers is complete (step S403: Yes).

On the other hand, when it is determined that selection is not complete for any of the exception signal end point registers (step S403: No), the check target extraction unit 110 selects one exception signal end point register (step S404). The check target extraction unit 110 then acquires the registers for the previous stage for the selected exception signal end point register (step S405). Specifically, the check target extraction unit 110 performs a fan-out-trace or the like. of all of the registers included in the logic circuit and acquires all of the registers (fan-in registers) of the previous stage for the exception signal end point register selected in step S404.

Figure 18:
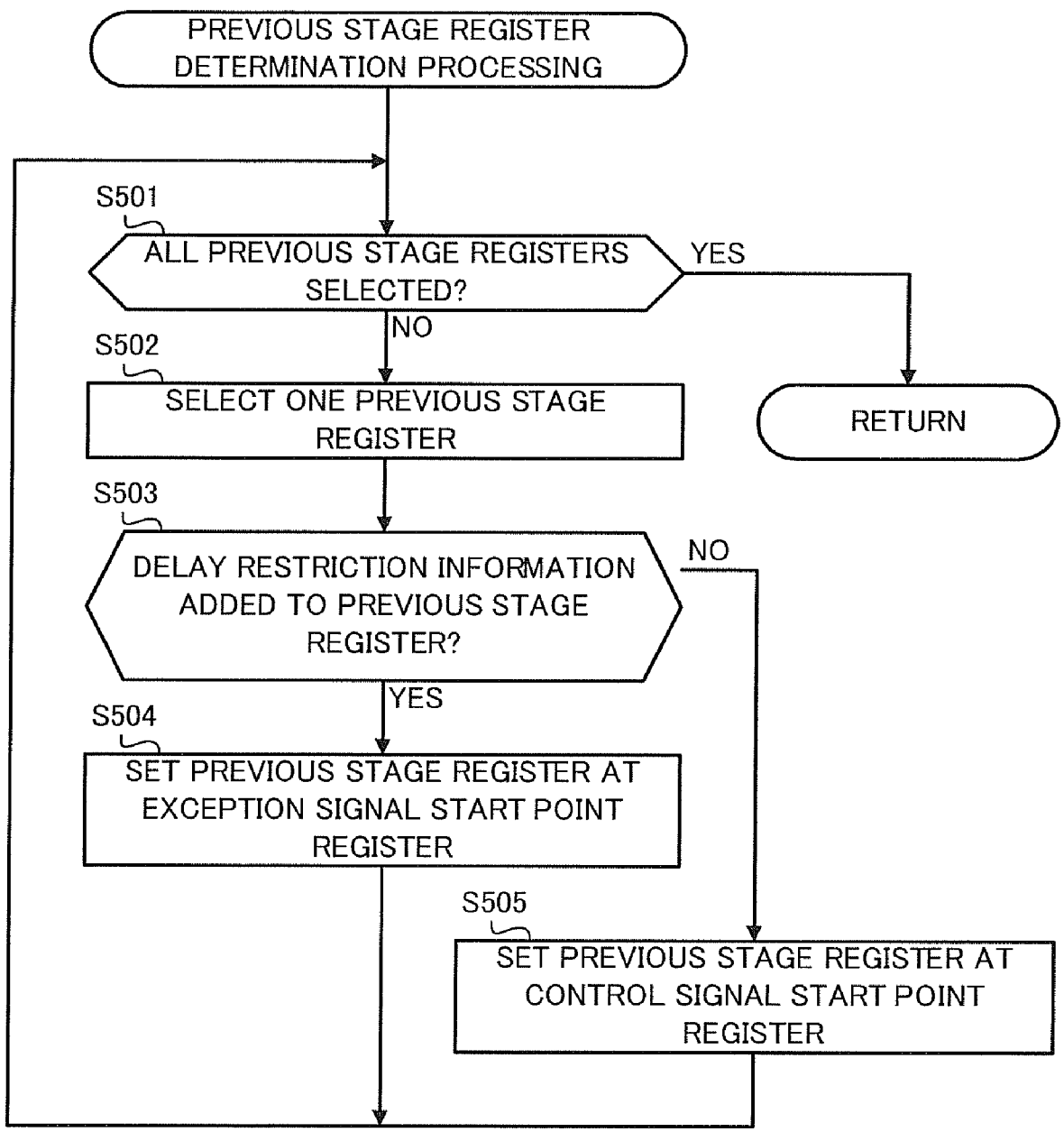
FIG. 18 is an example of a flowchart showing previous stage register determination processing of the second embodiment.

The check target extraction unit 110 then executes processing to determine the registers of the previous stage (step S406). An explanation of the previous stage register determination processing is now given with reference to the flowchart shown in FIG. 18.

First, the check target extraction unit 110 determines whether or not all of the registers for the previous stage have been selected (step S501). The check target extraction unit 110 then ends previous stage register determination processing when it is determined that selection of all of the registers of the previous stage is complete (step S501: Yes).

On the other hand, when it is determined that selection is not complete for any of the registers of the previous stage (step S501: No), the check target extraction unit 110 selects one register of the previous stage (step S502). The check target extraction unit 110 then determines whether or not delay restriction information is added to the selected previous stage register (step S503).

When it is determined that the delay restriction information is added to the selected previous stage register (step S503: Yes), the check target extraction unit 110 sets the previous stage register to the exception signal start point register (step S504). On the other hand, when it is determined that delay restriction information is not added to the selected register of the previous stage (step S503: No), the check target extraction unit 110 sets the previous stage register to the control signal start point register (step S505). When the processing of step S504 or step S505 is then complete, the check target extraction unit 110 returns to the processing of step S501.

The check target extraction unit 110 then repeatedly executes the processing described above (steps S501 to S505) until it is determined that all of the registers of the previous stage have been selected (step S501: Yes).

When the previous stage register determination processing is complete (step S406), the check target extraction unit 110 determines whether or not the exception signal start point register and the control signal start point register are both set (step S407). This is to say that the check target extraction unit 110 determines whether or not a register of the previous stage is set to the exception signal start point register in step S504, and determines whether or not a register of the previous stage is set to the control signal start point register in step S505. The processing of step S403 is then returned to when the check target extraction unit 110 determines that either of the exception signal start point register and the control signal start point register is not set (step S407: No). On the other hand, when it is determined that both the exception signal start point register and the control signal start point register are set (step S407: Yes), the check target information is stored in the check target information storage unit 230 (step S408).

Specifically, the check target extraction unit 110 stores check target information including information indicating the exception signal start point register set in step S504, information indicating the exception signal end point register selected in step S404, and information indicating the control signal start point register set in step S505 in the check target information storage unit 230. The check target extraction unit 110 then returns to the processing in step S403 after storing the check target information in the check target information storage unit 230.

The check target extraction unit 110 then repeatedly executes the processing described above (step S403 to step S408) until it is determined that all of the exception signal end point registers have been selected (step S403: Yes).

When the register 73 (END0_reg) is selected as the exception signal end point register in step S404, the register 71 (UNK1_reg) is set as the exception signal start point register in step S504, and the register 72 (A_reg) is set as the control signal start point register in step S505. The check target extraction unit 110 then stores check target information including information indicating an exception signal start point register UNK1_reg, information indicating an exception signal end point register END0_reg, and information indicating a control signal start point register A-reg in the check target information storage unit 230.

According to the static hazard detection device 100 of this embodiment, it is possible to automatically extract an exception signal start point register and a control signal start point register based on information indicating an exception signal end point register. It is therefore not necessary for the designer to specify information indicating that the register is a control signal start point register for the control signal start point register when designing the circuit. It is therefore possible to reduce the number of processes for the designer. It is also possible to prevent the designer from overlooking registers that are to be checked even when the designer forgets to specify the control signal start point register.

Third Embodiment

In the second embodiment, examples are shown where a register for the previous stage is determined to be an exception signal start point register or control signal start point register depending on whether or not delay restriction information is added to the register of the previous stage for the exception signal end point register. It is, however, also possible for the registers of the previous stage to be determined to be exception signal start point registers or control signal start point registers depending on what kind of clock signal is driving each register. The following is an explanation with reference to the drawings of the operation of the static hazard detection device 100 of a third embodiment of the present invention. With the exception of the previous stage register determination processing, the operation of the static hazard detection device 100 of the third embodiment is the same as the operation of the static hazard detection device 100 of the second embodiment. In the following explanation, an explanation is given of previous stage register determination processing executed by the static hazard detection device 100 of the third embodiment.

Figure 20:
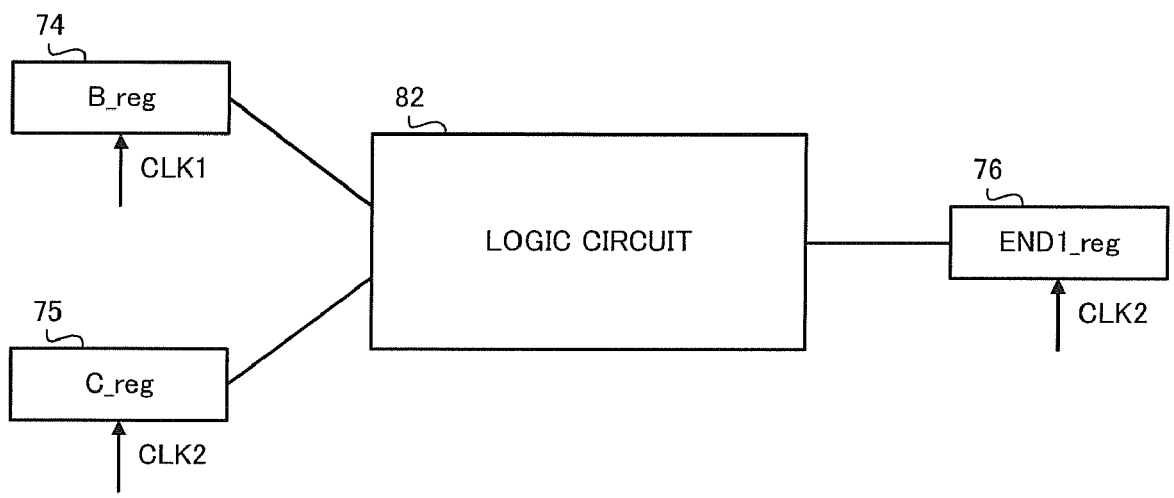
FIG. 20 is a diagram showing an example of a logic circuit made the target of a check in a third embodiment.

Here, an explanation is given of the case where the logic circuit information stored in the logic circuit information storage unit 210 denotes the logic circuit shown in FIG. 20. A brief explanation of the logic circuit shown in FIG. 20 is now given.

The logic circuit shown in FIG. 20 includes a register 74, a register 75, a register 76, and a logic circuit 82.

The register 74 is a register storing information indicating an exception signal signal level, i.e. the exception signal start point register. The register 74 in FIG. 20 is described as B_reg. The register 74 is a register driven by the first clock signal CLK1.

The register 75 is a register storing information indicating a signal level of a control signal, i.e. a control signal start point register. The register 75 in FIG. 20 is described as C_reg. The register 75 is a register driven by the second clock signal CLK2.

The register 76 is a register storing information indicating an exception signal signal level when propagation of the exception signal is not inhibited, i.e. an exception signal end point register. The register 76 in FIG. 20 is described as END1_reg. The register 76 is a register driven by the second clock signal CLK2.

The logic circuit 82 is a circuit including AND gates, OR gates, and inverters or the like. An exception signal is propagated to the register 76 from the register 74 via the logic circuit 82.

Figure 21:
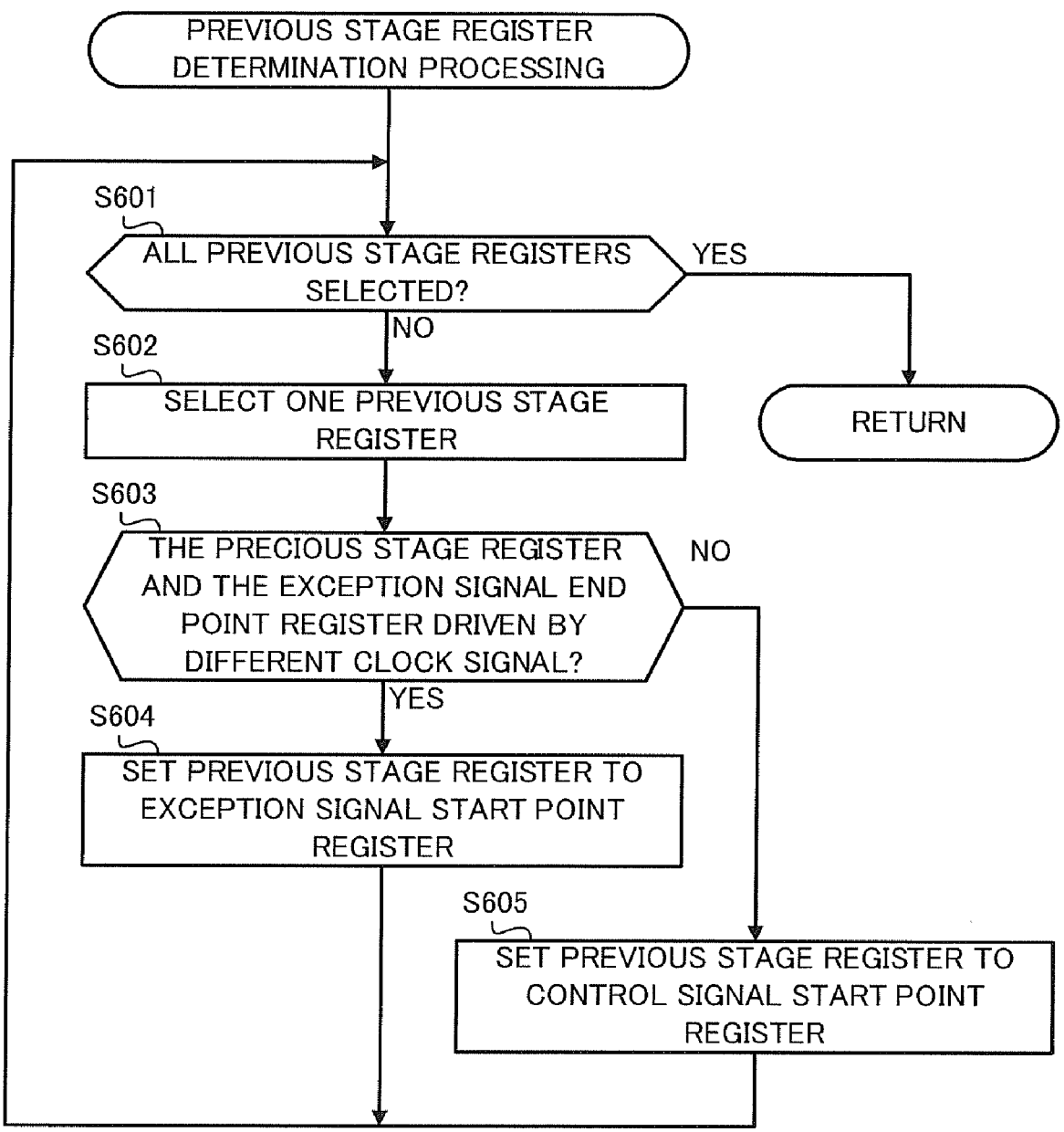
FIG. 21 is an example of a flowchart showing previous stage register determination processing of the third embodiment.

Next, an explanation is given of previous stage register determination processing executed by the check target extraction unit 110 with reference to the flowchart depicted in FIG. 21.

First, the check target extraction unit 110 determines whether or not all of the registers for the previous stage have been selected (step S601). The check target extraction unit 110 then ends previous stage register determination processing when it is determined that selection of all of the registers of the previous stage is complete (step S601: Yes).

On the other hand, when it is determined that selection is not complete for any of the registers of the previous stage (step S601: No), the check target extraction unit 110 selects one register of the previous stage (step S602). The check target extraction unit 110 determines whether or not the register of the previous stage selected in step S602 and the exception signal end point register selected in step S404 are driven by different clock signals (step S603).

Information indicating what kind of clock signal each register is driven by is included in the delay restriction information. The check target extraction unit 110 then determines whether or not the register for the previous stage selected in step S602 and the exception signal end point register selected in step S404 are driven by different clock signals based on the delay restriction information.

When the check target extraction unit 110 determines that the register of the previous stage selected in step S602 and the exception signal end point register selected in step S404 are driven by different clock signals (step S603: Yes), the register of the previous stage is set to the exception signal start point register (step S604). When the check target extraction unit 110 determines that the register of the previous stage selected in step S602 and the exception signal end point register selected in step S404 are driven by the same clock signal (step S603: No), the register of the previous stage is set to the control signal start point register (step S605). When the processing of step S604 or step S605 is then complete, the check target extraction unit 110 returns to the processing of step S501.

The check target extraction unit 110 then repeatedly executes the processing described above (steps S501 to S505) until it is determined that all of the registers of the previous stage have been selected (step S601: Yes).

When the register 76 (END1_reg) is selected as the exception signal end point register in step S404, the register 74 (B_reg) is set as the exception signal start point register in step S604, and the register 75 (C_reg) is set as the control signal start point register in step S605. In step S408, the check target extraction unit 110 then stores check target information including information indicating an exception signal start point register B_reg, information indicating an exception signal end point register END1_reg, and information indicating a control signal start point register B_reg in the check target information storage unit 230.

According to the static hazard detection device 100 of this embodiment, it is possible to automatically extract exception signal start point registers and control signal start point registers even when delay restriction information is not added to the exception signal start point registers.

The check target extraction processing, the path detection processing, and the reconvergence path extraction processing executed by the static hazard detection device of the present invention is not limited to the processing shown in the flowcharts in the drawings.

For example, in the first embodiment, for the registers of the following stage for the exception signal start point registers the method of extracting registers to which both an exception signal outputted by the exception signal start point register and a control signal outputted by the control signal start point register are supplied as exception signal end point registers is arbitrary.

Further, for example, in the second embodiment, the method of extracting registers, of the registers for the previous stage for the exception signal end point registers, to which delay restriction information is added, as exception signal start point registers is arbitrary.

Further, for example, in the third embodiment, the method of extracting registers, of the registers for the previous stage for the exception signal end point registers, that are driven by a clock signal different from that of the exception signal end point register as exception signal start point registers is arbitrary.

Further, the methods of extracting various registers existing within the logic circuit are not limited to the methods shown in the first to third embodiments and combinations of the methods shown in the first to third embodiments are also possible. For example, the exception signal start point registers may be extracted based on delay restriction information or based on naming rules, and registers for the previous stage for the exception signal end point registers can also be extracted based on an operating clock or delay restriction information. Further, for example, the exception signal end point registers can be extracted based on delay restriction information or based on naming rules, and registers for the following stage for the exception signal start point registers can also be extracted based on an operating clock or delay restriction information.

In the first to third embodiments, an explanation is given where a program executed by a static hazard detection device is memorized in advance on a storage device in which the static hazard detection device or the like. is provided with. The program for executing the processing described above can be stored and distributed on a computer-readable recording medium such as a flexible disk, CD-ROM (Compact Disk Read-Only Memory), DVD (Digital Versatile Disk), or an MO (Magnetic Optical Disk) or the like, can be stored on a separate computer so as to enable the computer to operate in the above manner, or can execute the above steps.

Is also possible for the program to be stored on a disk device that is on a server device on the Internet, for example, the program can be downloaded to a computer through superposition with a carrier wave for execution.

According to the present invention, it is possible to automatically check as to whether or not static hazards are possible to occur even for logic circuits with a control signal for controlling propagation of exception signals introduced.

The present invention is preferable for use in applications such as checking whether or not the occurrence of static hazards caused by glitches is possible even for logic circuits that propagate exception signals of timings such as for multi-cycle signals and asynchronous signals.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

What is claimed is:

1. A static hazard detection device that detects a static hazard occurring at a logic circuit where propagation of an exception signal that propagates without being synchronized with a logic circuit operating clock is controlled by a propagation control circuit, the static hazard detection device comprising:

a check target extraction unit that receives logic circuit information describing a logic circuit, and extracts at least one set of a start point register and an end point register from registers in the logic circuit, the start point register outputting an exception signal to be supplied to the end point register via the propagation control circuit; and a static hazard detection unit that determines whether, for the at least one set extracted by the check target extraction unit, there are a plurality of paths through which propagation of an exception signal from a start point register to an end point register is possible when the propagation control circuit, in response to a control signal, inhibits propagation of the exception signal.

2. The static hazard detection device according to claim 1, wherein the check target extraction unit extracts a plurality of sets, each set includes a start point register and an end point register, and the static hazard detection unit comprises:

a path detection unit that detects at least one path through which propagation of the exception signal from the start point register to the end point register is possible when the propagation control circuit inhibits propagation of the exception signal in response to the control signal, for each of the sets extracted by the check target extraction unit; and a reconvergence path detection unit that detects sets, of the plurality of sets extracted by the check target extraction unit, that are detected to have a plurality of paths by the path detection unit.

3. The static hazard detection device according to claim 1, wherein the check target extraction unit comprises:

a start point register extraction unit that extracts a start point register existing within the logic circuit based on first delay restriction information defining a delay restriction for an exception signal to be outputted by the start point register;

a control signal output register extraction unit that extracts a control signal output register existing within the logic circuit based on information specifying a control signal output register outputting a control signal; and a set extraction unit for extracting a set of the start point register extracted by the start point register extraction unit and a register of the stage next to the start point register, the resister being provided with both an exception signal to be outputted from the start point register and a control signal to be outputted from the control signal output register extracted by the control signal output register extraction unit.

4. The static hazard detection device according to claim 1, wherein the check target extraction unit comprises:

a start point register extraction unit that extracts a start point register existing within the logic circuit based on first delay restriction information defining a delay restriction for an exception signal to be outputted by the start point register;

an end point register extraction unit that extracts an end point register existing within the logic circuit based on second delay restriction information defining a delay restriction for an exception signal to be supplied to the end point register; and a set extraction unit that extracts a set of a register of a start point register extracted by the start point register extraction unit, the start point register of the stage preceding the end point register extracted by the end point register extraction unit, and the end point register.

5. The static hazard detection device according to claim 1, wherein the check target extraction unit comprises:

an end point register extraction unit that extracts an end point register existing within the logic circuit based on second delay restriction information that defines a delay restriction of an exception signal supplied to the end point register; and a set extraction unit for extracting a set of a register of the stage preceding the end point register extracted by the end point register extraction unit, the register being driven by a clock signal different from the signal for the end point register, and the end point register.

6. The static hazard detection device according to claim 1, further comprising:

a display device; and a display control unit that displays information indicating sets detected by the static hazard detection unit at the display device.

7. The static hazard detection device according to claim 6, wherein the display control unit displays, on the display device, a message informing that a static hazard will not occur when the static hazard detection unit does not detect any sets.

8. A computer-implemented method for detecting a static hazard occurring at a logic circuit that controls the propagation of an exception signal by a propagation control circuit, the exception signal being propagated without being synchronized to an operating clock of a logic circuit, the method comprising:

receiving logic circuit information describing a logic circuit, extracting at least one set of a start point register and an end point register from registers in the logic circuit, the start point register outputting an exception signal to be supplied to the end point register via the propagation control circuit, and storing the at least one set in a check target information storage unit; and determining whether, for the at least one set extracted by the check target extraction unit, there are a plurality of paths through which propagation of an exception signal from a start point register to an end point register is possible when the propagation control circuit, in response to a control signal, inhibits propagation of the exception signal, and storing the plurality of paths in a path report storage unit.

9. The computer-implemented method according to claim 8, further comprising:

extracting a plurality of sets, each set includes a start point register and an end point register;

detecting at least one path through which propagation of the exception signal from the start point register to the end point register is possible when the propagation control circuit inhibits propagation of the exception signal in response to the control signal, for each of the extracted sets; and detecting sets, of the plurality of extracted sets, that are detected to have a plurality of paths.

10. The computer-implemented method according to claim 8, further comprising:

extracting a start point register existing within the logic circuit based on first delay restriction information defining a delay restriction for an exception signal to be outputted by the start point register;

extracting a control signal output register existing within the logic circuit based on information specifying a control signal output register outputting a control signal; and extracting a set of the extracted start point register and a register of the stage next to the start point register, the resister being provided with both an exception signal to be outputted from the start point register and a control signal to be outputted from the extracted control signal output register.

11. The computer-implemented method according to claim 8, further comprising:
extracting a start point register existing within the logic circuit based on first delay restriction information defining a delay restriction for an exception signal to be outputted by the start point register;
extracting an end point register existing within the logic circuit based on second delay restriction information defining a delay restriction for an exception signal to be supplied to the end point register; and
extracting a set of a register of an extracted start point register, the extracted start point register of the stage preceding the end point register, and the end point register.

12. The computer-implemented method according to claim 8, further comprising:
extracting an end point register existing within the logic circuit based on second delay restriction information defining a delay restriction for an exception signal supplied to the end point register; and
extracting a set of a register of the stage preceding the extracted end point register, the register being driven by a clock signal different from the signal for the end point register, and the end point register.

13. The computer-implemented method according to claim 8, futher comprising displaying information indicating detected sets at a display device.

14. The computer-implemented method according to claim 13, further comprising displaying a message informing that a static hazard will not occur when no sets are detected.

15. A non-transitory computer-readable recording medium that stores a program allowing a computer to function as a static hazard detection device that detects a static hazard occurring at a logic circuit that controls the propagation of an exception signal by a propagation control circuit, the exception signal being propagated without being synchronized to an operating clock of a logic circuit, the program allowing the computer to function as:
a check target extraction unit that receives logic circuit information describing a logic circuit, and extracts at least one set of a start point register and an end point register from registers in the logic circuit, the start point register outputting an exception signal to be supplied to the end point register via the propagation control circuit; and
a static hazard detection unit that determines whether, for the at least one set extracted by the check target extraction unit, there are a plurality of paths through which propagation of an exception signal from a start point register to an end point register is possible when the propagation control circuit, in response to a control signal, inhibits propagation of the exception signal.

16. The non-transitory computer-readable recording medium according to claim 15, wherein:
the check target extraction unit extracts a plurality of sets, each set includes a start point register and an end point register; and
the static hazard detection unit comprises:
a path detection unit that detects at least one path through which propagation of the exception signal from the start point register to the end point register is possible when the propagation control circuit inhibits propagation of the exception signal in response to the control signal, for each of the sets extracted by the check target extraction unit; and
a reconvergence path detection unit that detects sets, of the plurality of sets extracted by the check target extraction unit, that are detected to have a plurality of paths by the path detection unit.

17. The non-transitory computer-readable recording medium according to claim 15, the check target extraction unit comprising:
a start point register extraction unit that extracts a start point register existing within the logic circuit based on first delay restriction information defining a delay restriction for an exception signal to be outputted by the start point register;
a control signal output register extraction unit that extracts a control signal output register existing within the logic circuit based on information specifying the control signal output register outputting the control signal; and
a set extraction unit for extracting a set of the start point register extracted by the start point register extraction unit and a register of the stage next to the start point register, the resister being provided with both an exception signal to be outputted from the start point register and a control signal to be outputted from the control signal output register extracted by the control signal output register extraction unit.

18. The non-transitory computer-readable recording medium according to claim 15, the check target extraction unit comprising:
a start point register extraction unit that extracts a start point register existing within the logic circuit based on first delay restriction information defining a delay restriction for an exception signal to be outputted by the start point register;
an end point register extraction unit that extracts an end point register existing within the logic circuit based on second delay restriction information defining a delay restriction for an exception signal to be supplied to the end point register; and
a set extraction unit that extracts a set of a start point register extracted by the start point register extraction unit, the start point register of the stage preceding the end point register extracted by the end point register extraction unit, and the end point register.

19. The non-transitory computer-readable recording medium according to claim 15, wherein the check target extraction unit comprises:
an end point register extraction unit that extracts an end point register existing within the logic circuit based on second delay restriction information that defines a delay restriction of an exception signal supplied to the end point register; and
a set extraction unit for extracting a set of a register of the stage preceding the end point register extracted by the end point register extraction unit, the register being driven by a clock signal different from the signal for the end point register, and the end point register.

20. The non-transitory computer-readable recording medium according to claim 15, the computer further comprising a display device, and the program further allowing the computer to function as a display control unit that displays information indicating sets detected by the static hazard detection unit at the display device.

* * * * *